US008239798B1

(12) United States Patent
Goyal et al.

(10) Patent No.: US 8,239,798 B1
(45) Date of Patent: Aug. 7, 2012

(54) METHODS, SYSTEMS, AND APPARATUS FOR VARIATION AWARE EXTRACTED TIMING MODELS

(75) Inventors: Ratnakar Goyal, Delhi (IN); Naresh Kumar, New Delhi (IN); Harindranath Parmeswaran, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 730 days.

(21) Appl. No.: 12/185,072

(22) Filed: Aug. 2, 2008

Related U.S. Application Data

(60) Provisional application No. 60/953,980, filed on Aug. 3, 2007.

(51) Int. Cl.
*G06F 17/50* (2006.01)
(52) U.S. Cl. .......................... 716/113; 716/134
(58) Field of Classification Search .................. None
See application file for complete search history.

(56) References Cited

U.S. PATENT DOCUMENTS

| | | | | |
|---|---|---|---|---|
| 5,790,830 | A * | 8/1998 | Segal | 706/6 |
| 6,928,630 | B2 * | 8/2005 | Moon et al. | 716/134 |
| 7,356,451 | B2 * | 4/2008 | Moon et al. | 703/19 |
| 7,657,855 | B1 * | 2/2010 | Manaker et al. | 716/113 |
| 7,689,954 | B2 * | 3/2010 | Zhang et al. | 716/113 |
| 7,793,245 | B2 * | 9/2010 | Zhang et al. | 716/113 |
| 7,882,471 | B1 * | 2/2011 | Kariat et al. | 716/113 |
| 2003/0120474 | A1 * | 6/2003 | Moon et al. | 703/19 |

OTHER PUBLICATIONS

Clark, "The Greatest of a Finite Set of Random Variables," Operations Research, vol. 9, No. 2 (Mar.-Apr. 1961), pp. 145-162.*
Moon et al., "Timing Model Extraction of Hierarchical Blocks by Graph Reduction," DAC 2002, pp. 152-157.*
Zhang et al., "Block Based Statistical Timing Analysis with Extended Canonical Timing Model," ASP-DAC 2005 IEEE, pp. 250-253.*
Zhang et al., "Statistical Timing Analysis with Extended Pseudo-Canonical Timing Model," Proc. of the Design, Automation and Test in Europe Conference and Exhibition (DATE'05), 2005 IEEE, 6 pages.*
Wang et al., "A Novel Criticality Computation Method in Statistical Timing Analysis," 2007 EDAA, 6 pages.*
Visweswariah et al., "Formulation of Static Circuit Optimization with Reduced Size, Degeneracy and Redundancy by Timing Graph Manipulation," 1999 IEEE, pp. 244-251.*
Visweswariah et al., "First-Order Incremental Block-Based Statistical Timing Analysis," DAC 2004, pp. 331-336.*
Zhang et al., "Convergence-Provable Statistical Timing Analysis with Level-Sensitive Latches and Feedback Loops," ASP-DAC 2006, pp. 941-946.*
Visweswariah et al., "Death, Taxes and Failing Chips," DAC 2003, pp. 343-347.*
Chen, R.; Zhang, L.; Zolotov, V.; Visweswariah, C.; & Xiong, J.; "Static Timing: Back to Our Roots"; Design Automation Conference (DAC) 2008; 6 pages.

* cited by examiner

*Primary Examiner* — Leigh Garbowski
(74) *Attorney, Agent, or Firm* — Alford Law Group, Inc.; William E. Alford

(57) ABSTRACT

In one embodiment of the invention, a method of analysis of a circuit design is disclosed to generate a statistical timing model. The method includes receiving a timing graph of a circuit including arcs with a statistical function of delay, slew, or arrival time; determining primary input ports and output ports of the circuit; identifying timing pins between the input ports and the output ports of the circuit; and evaluating the timing pins from input ports to output ports to reduce the timing graph to ease analysis of the reduced timing graph with a processor.

29 Claims, 13 Drawing Sheets

(BACKGROUND)

(BACKGROUND)

(BACKGROUND)

(BACKGROUND)

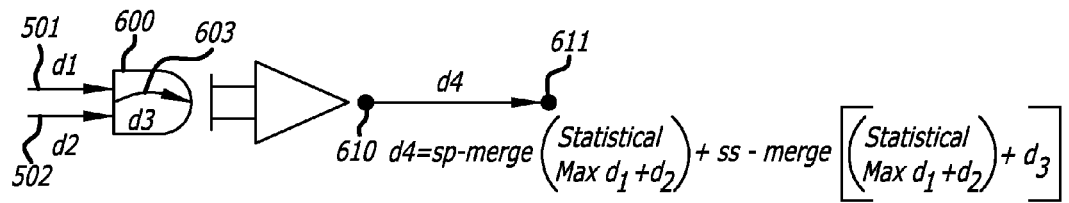
FIG. 6
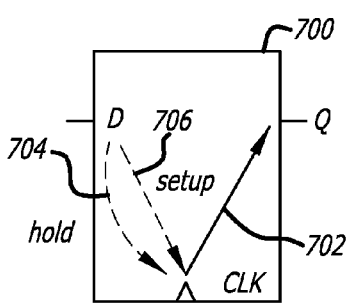
FIG. 7A
| CLK | Q | Transition |
|---|---|---|
| Rising | Rising | True |
| Rising | Falling | True |
| Falling | Rising | False |
| Falling | Falling | False |
FIG. 7B

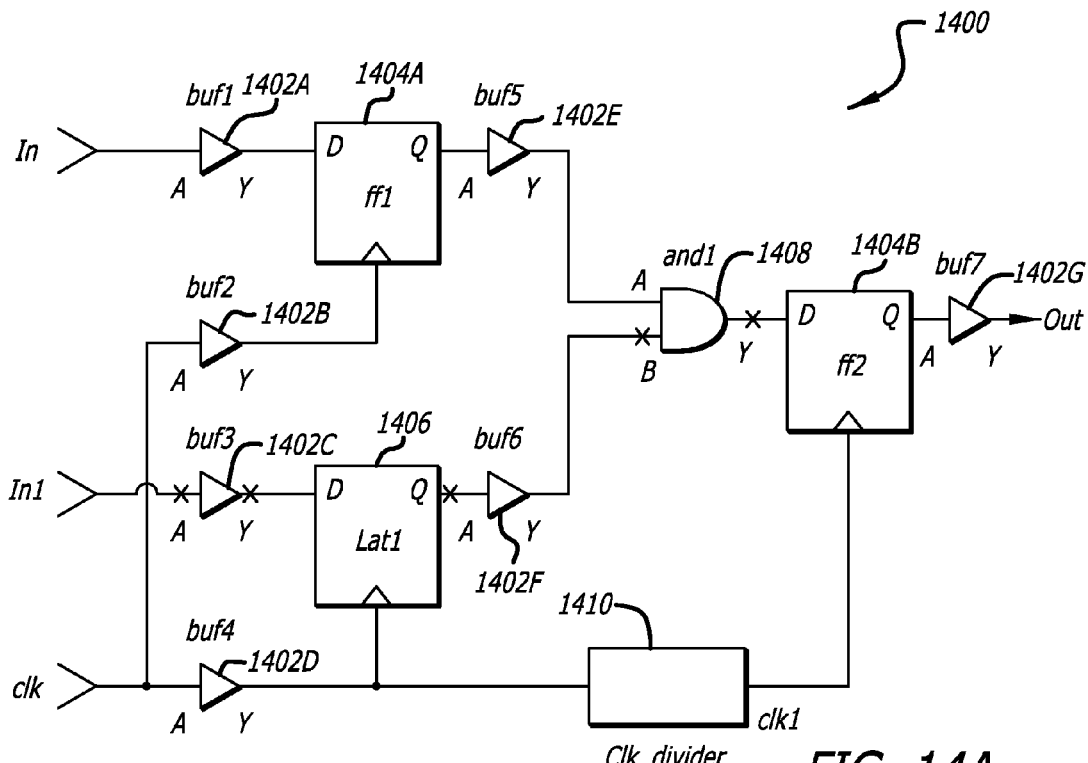

FIG. 14A

```
create_clock-period 10-name clk[get_ports clk]  ⸺ 1451
create_generated_clock-name gclk-master clk-divide_by 2 [get_pins clk_divider/Y]  ⸺ 1452
set_multicycle_path 2 -from [get_ports in]  ⸺ 1453
set_false_path -through [get_pins buf3/A] -through [get_pins buf3/Y] ⸺ 1454
set_false_path -from [get_pins lat1/Q]-through [get_pins and1/B] -through [get_pins and1/T]
set_input_delay 1.5 [get_ports in]  ⸺ 1456                                              ⸺ 1455
1450 set_input_delay 1 [get_ports in1]  ⸺ 1457
set_output_delay 1.2 [get_ports out]  ⸺ 1458
set_input_transition 0.120 [get_ports in]  ⸺ 1459
set_input_transition 0.15 [get_ports in1]  ⸺ 1460
set_case_analysis 0 [get_pins and1/A]  ⸺ 1461
```

FIG. 14B

METHODS, SYSTEMS, AND APPARATUS FOR VARIATION AWARE EXTRACTED TIMING MODELS

CROSS REFERENCE TO RELATED APPLICATIONS

This non-provisional U.S. patent application claims the benefit of U.S. Provisional Patent Application No. 60/953,980 entitled VARIATION AWARE EXTRACTED TIMING MODEL filed on Aug. 3, 2007 by Ratnakar Goyal et al., which is expressly incorporated herein by this reference in its entirety.

FIELD

The embodiments of the invention relate generally to timing analysis of integrated circuits. More particularly, the embodiments of the invention relate to statistical static timing analysis (SSTA).

BACKGROUND

Technology to shrink devices and wire interconnects in order to manufacture integrated circuits seems to improve each year. As the devices and wire interconnects have been shrunk so much, the inherent effect of process variations during manufacturing of integrated circuits is playing an increasingly larger factor in the behavior and performance of a circuit.

To compensate for such behavior, static timing analysis (STA) was used with a corner-based approach. That is, a circuit would be analyzed using a STA tool at different process corners. However, as process technology has made it capable to manufacture even smaller geometries of devices and interconnect, the effect of process variations in the manufacturing process may not be adequately captured with a corner-based static timing analysis.

Additionally, a corner-based static timing analysis may predict worse conditions than actually occur in manufacturing an integrated circuit. This may be particularly the case if all of the parameters are set to worst case in one corner and all are set to best case in another. The corner-based static timing technique can respectively lead to integrated circuit designs which are overly conservative due to the worst case corner and/or may provide overly optimistic timing analysis results due to the best case corner. Additionally, a corner-based static timing analysis is expensive in terms of run-time and/or performance. To perform an exhaustive analysis, the number of times that a corner based static timing analysis is executed can grow exponentially as a function of the number of process parameters considered. The number of corner based static timing analysis runs may be too large to permit computational efficiency.

It is desirable to provide a more accurate timing analysis to avoid over designing an integrated circuit and to reduce the time to design and analyze an integrated circuit prior to manufacturing.

BRIEF SUMMARY

The embodiments of the invention are best summarized by the claims that follow below.

Briefly, in accordance with one embodiment of the invention, a method of analyzing a circuit design is disclosed. The method includes receiving a timing graph of a circuit, the timing graph including timing arcs with a statistical function of delay, slew, slack, and/or arrival time. To reduce the timing graph, the method further includes evaluating the timing pins in the timing graph from the input ports to the output ports to determine if they may be merged with another so that one or more timing arcs can be eliminated. With a reduced timing graph to model the timing of the circuit, further analysis of the circuit by a processor is eased when instantiated into larger integrated circuits.

In accordance with another embodiment of the invention, instructions are executed to cause a machine or processor to perform operations on a circuit design. The operations performed on the circuit design include extracting a timing graph from the circuit design. The timing graph includes timing arcs between timing pins, each having a statistical function of delay, slew, slack, or arrival time. The operations performed further include reducing the timing graph of the circuit design. The timing graph of the circuit design may be reduced by statistically merging a plurality of timing arcs together. The reduced timing graph can simplify computations for a processor and speed up the analysis of a larger circuit design that includes the circuit design modeled by the reduced timing graph.

BRIEF DESCRIPTIONS OF THE DRAWINGS

FIG. 6 illustrates a schematic and arcs of a timing graph and the combination of an SP-merge operation with an SS-merge operation.

FIG. 7A illustrates an exemplary timing graph for a sequential circuit (e.g., D-flip flop/register or latch).

FIG. 7B illustrates an exemplary transition matrix for the CLK to Q delay arc of FIG. 7A.

FIG. 14A is a schematic of an exemplary circuit design.

FIG. 14B is an exemplary list of constraints for the exemplary circuit design of FIG. 14A.

DETAILED DESCRIPTION

Figure 1A:
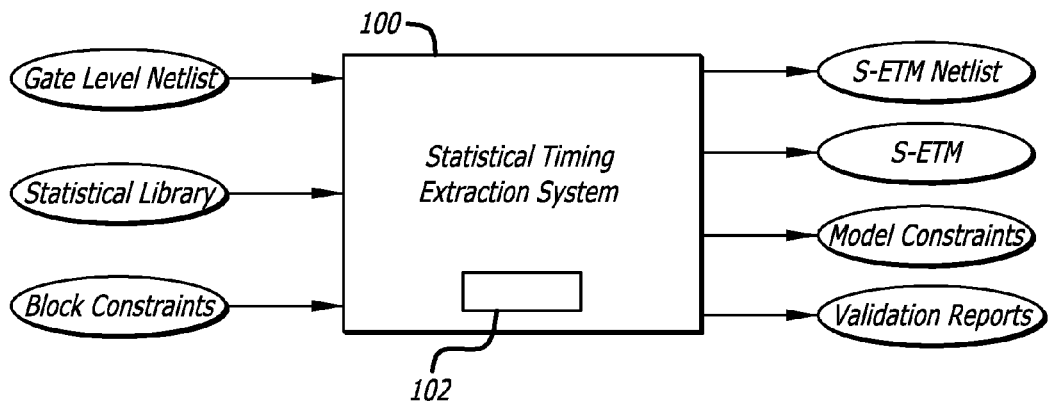
FIG. 1A is a block diagram of a statistical extracted timing model (S-ETM) system.

In the following detailed description of the embodiments of the invention, numerous specific details are set forth in order to provide a thorough understanding of the present invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The embodiments of the invention include a method, apparatus and system for statistical model extraction to form a statistical timing model for statistical static timing analysis (SSTA).

Instead of generating a static timing model of gates and devices using static model extraction techniques to perform a static timing analysis, the embodiments of the disclosed statistical timing model factors in the effect of process variations in timing analysis. The basic idea of SSTA is to take the distribution of the process (electrical) parameters and, under a set of assumptions, propagate this distribution space (in terms of the timing activities) along the circuit. One of the primary results that a user gets from using SSTA is the functional/timing yield of the design, in terms of the percentage of functional chips at a given frequency for a process lot or wafer lot.

Variations that effect timing characteristics of an integrated circuit can broadly be categorized into two classes, process variations and environmental variations. Process variations result from perturbations in the fabrication process that change the values of parameters such as the effective transistor channel lengths, transistor widths, oxide thicknesses, dopant concentrations, dielectric thicknesses, and interconnect heights and widths. Environmental variations arise due to changes in the operating environment of the circuit, such as the temperature or variations in the power supply voltage levels.

Process variations can be further broadly classified into interdie or die-to-die (D2D) variations and intradie or within-die (WID) variations categories. Generally, interdie or D2D process variations affect all circuit cells on a single integrated circuit chip or die in the same way. Intradie or WID process variations vary from location to location in the same integrated circuit chip or die.

The variations can also be classified as being systematic or random. Generally, systematic interdie or D2D variations affect all the cells on a single die in the same manner. In contrast, random interdie or D2D variations affect different cells on a single chip differently. Random interdie or D2D variations arise from various factors, one of which is transistor mismatch.

Interdie variations are the variations from die to die, and affect all the devices on the same chip in the same way. For example, interdie variations may result in all transistor gate lengths of circuit devices on the same chip being larger or all transistor gate lengths of circuit devices on the same chip being smaller.

Intradie variations correspond to variability within a single chip, and may affect different devices on the same chip differently. For example, intradie variations may be the result of some circuit devices having smaller oxide thicknesses than the nominal, while other circuit devices on the same chip have larger oxide thicknesses.

Interdie variations have been a long-standing design issue, and for several decades, designers have striven to make their circuits robust under the unpredictability of such variations. This has typically been achieved by simulating the design at not just one design point, but at multiple "corners." These corners are chosen to encapsulate the behavior of the circuit under the worst-case variations, and have served designers well in the past. In nanometer technologies, intradie variations have become significant and can no longer be ignored. As a result, a process corner-based methodology, which would simulate the entire chip at a small number of design corners, is no longer sustainable, and such a procedure will be very conservative and pessimistic. For true accuracy, this can be overcome by using a larger number of process corners, but this number may be too large to permit computational efficiency.

Unlike interdie variations, whose effects can be captured by a small number of STA runs at the process corners, a more sophisticated approach is called for in dealing with intradie variations. Traditional STA techniques are limited by their deterministic nature. An alternative approach that overcomes these problems is SSTA. SSTA treats delays not as fixed numbers, but as probability density functions (PDFs) or cumulative density functions (CDFs), taking the statistical distribution of parametric variations into consideration while analyzing the circuit.

Random variations (as the name implies) depict random behavior that can be characterized in terms of a distribution. This distribution may either be explicit, in terms of a large number of samples provided from fabrication line measurements, or implicit, in terms of a known PDF (such as a Gaussian or a lognormal distribution) that has been fitted to the measurements.

Random variations in some process or environmental parameters (such as the temperature, supply voltage, or effective channel length) can often show some degree of local spatial correlation, whereby variations in one transistor in a chip are remarkably similar in nature to those in spatially neighboring transistors, but may differ significantly from those that are far away. Other process parameters (such as oxide thickness and dopant concentration) do not show much spatial correlation at all, so that for all practical purposes variations in neighboring transistors are uncorrelated.

Systematic variations show predictable variational trends across a chip, and are caused by known physical phenomena during manufacturing. Strictly speaking, environmental changes are entirely predictable, but practically, due to the fact that these may change under a large number (potentially exponential in the number of inputs and internal states) of operating modes of a circuit, it is easier to capture them in terms of random variations. Examples of systematic variations include those due to spatial intrachip gate length variability, which observes systematic changes in the value of L a across a reticle due to effects such as changes in the stepper-induced illumination and imaging non-uniformity due to lens aberrations, or ILD variations, due to the effects of chemical-mechanical polishing (CMP) on metal density patterns.

The existence of correlations between intradie variations complicates the task of statistical analysis. There are spatial correlations and structural correlations.

Spatial correlations are used to model the intradie spatial correlations of parameters. Thus, a die region may be divided up tessellated into n grids. Since devices or wires close to each other are more likely to have similar characteristics than those placed far away, it is reasonable to assume perfect correlation among the devices (wires) in the same grid, high correlation among those in close grids and low or zero correlation in far-away grids. Under this model, a parameter variation in a single grid at location (x, y) can be modeled using a single random variable p(x, y). For each type of parameter, n random variables are needed, each representing the value of a parameter in one of the n grids.

Structural correlations are those in the structure of the circuit that lead to correlations and should be incorporated into SSTA. For example, a data path may split and then reconverge at a later point. The maximum delay of a circuit may depend upon which path has the greater delay. Thus, with respect to an SSTA delay calculation, there is a correlation in the structure of the circuit.

Referring now to FIG. 1A, a block diagram of a statistical timing extraction system 100 is illustrated. The statistical timing extraction system 100 generates statistical static timing models using an SSTA engine 102. The statistical timing extraction system 100 receives as inputs a netlist, a standard cell timing library (with statistical information), block constraints, and various options to control the abstracted model. The output generated by the statistical timing extraction system 100 is an abstracted statistical timing model and includes an interface netlist, a single cell statistical timing library, a set of updated constraints, and a validation report.

As mentioned previously, the statistical timing extraction system 100 generates block based statistical static timing models using an SSTA engine 102. That is, the system 100 operates on functional blocks of an integrated circuit to determine the statistical timing for that given block and extract the timing model considering statistical timing.

Figure 1B:
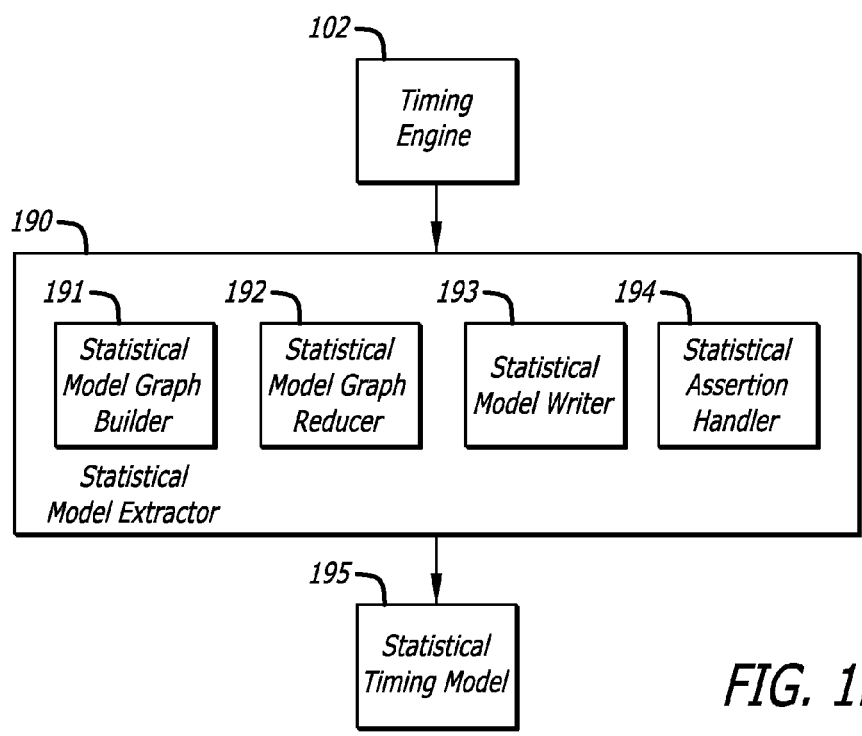
FIG. 1B illustrates a more detailed block diagram of the S-ETM system architecture for model extraction.

Referring now to FIG. 1B, a more detailed block diagram of the S-ETM system architecture 100 for statistical model extraction is illustrated. The SETM system 100 includes the SSTA engine 102, and a statistical model extractor mechanism 190. The statistical model extractor mechanism 190 comprises four functional components including a statistical model graph builder 191, a statistical model graph reducer 192, a statistical model writer 193, and a statistical assertion handler 194. The statistical model extractor mechanism 190 generates a statistical timing model 195 for use in statistical static timing analysis.

The statistical model graph builder 191 copies the original timing graph from the timing engine 102 to a new model graph. The statistical model graph reducer 192 is the extractor's core engine that simplifies the model graph. The statistical model writer 193 writes out a timing model from the reduced model graph. The statistical assertion handler 194 takes care of original timing constraints.

To perform statistical timing analysis on the blocks of an integrated circuit, a first order parameterized statistical approach may be used. However, the statistical timing model generation and reduction techniques described herein can be used with other statistical timing analysis techniques.

In the first order parameterized approach, various timing attributes, such as delay and slew, are modeled as linear first order functions of process parameters and can be represented as:

$$a = a_0 + \Sigma_{i=1-n}(a_i \Delta X_i) + a_{n+1} \Delta R_a$$

where
- $a_0$ is the mean or nominal value,
- $X_i$ represent the "n" global sources of variation,
- $a_i$ represent the sensitivities of a to $X_i$ and is computed by varying $X_i$ from 0 to sigma,
- $\Delta R_a$ is the variation of an independent random variable $R_a$, and
- $a_{n+1}$ is the sensitivity of timing to $R_a$.

Model Extraction

Model extraction is performed, at least in part, by reducing a timing graph. The timing graph is formed using a statistical timing analysis tool in response to the various process variables that affect timing. At a block level, timing properties across the boundary of the block being extracted are considered to remain the same. The timing graph is formed with delay distributions and slew distributions (probability density functions) for each node in the timing graph.

Figure 2A:
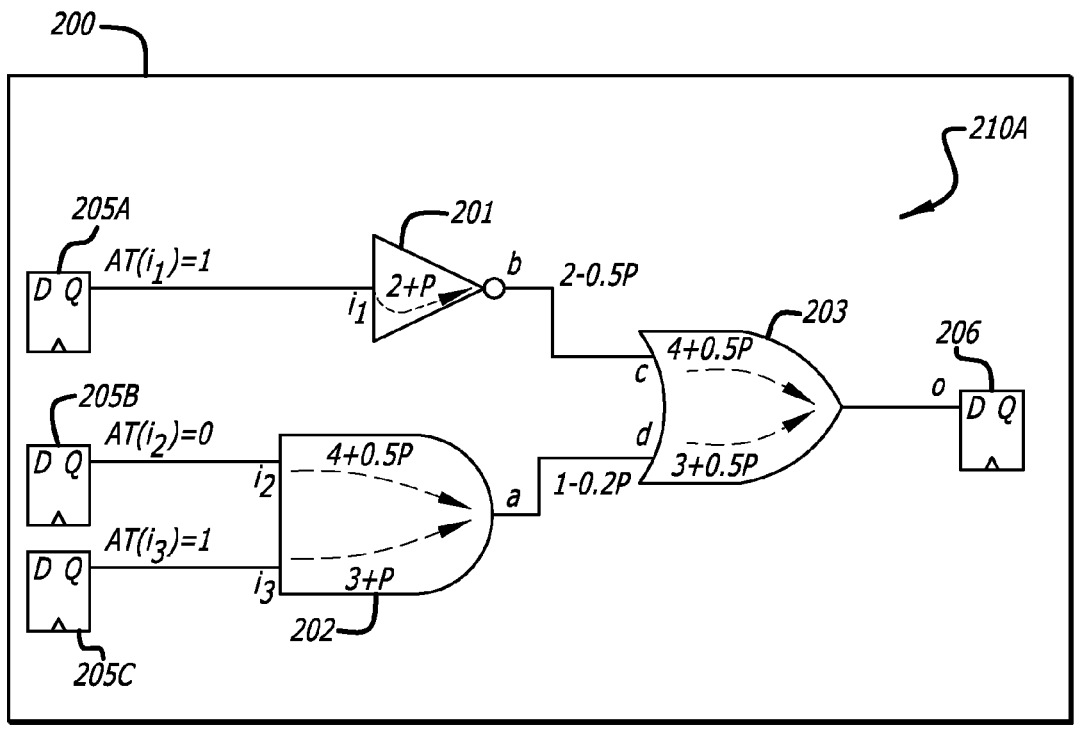
FIG. 2A illustrates a schematic diagram, a pictorial illustration of a netlist, of an exemplary circuit.

FIG. 2A illustrates an exemplary schematic, a pictorial representation of an exemplary netlist for an exemplary circuit 210A of a functional block 200. The exemplary circuit includes logic gates of an inverter 201, an AND gate 202, and an OR gate 203 coupled together as shown. A first input I1 is coupled to the input of the inverter 201. A second input I2 and a third input I3 are coupled to the first and second inputs of the AND gate 202. The NOR gate 203 has a first input c coupled to the output b of the inverter 201 and a second input d coupled to the output a of the AND gate 202 to generate signals on an output O.

The output of a respective clocked latch or D flip flop 205A-205C may be coupled to the inputs I1, I2, and/or I3 of the circuit 210A. The input of a clocked latch or D flip flop 206 may be coupled to the output O of the circuit 210A.

Figure 2B:
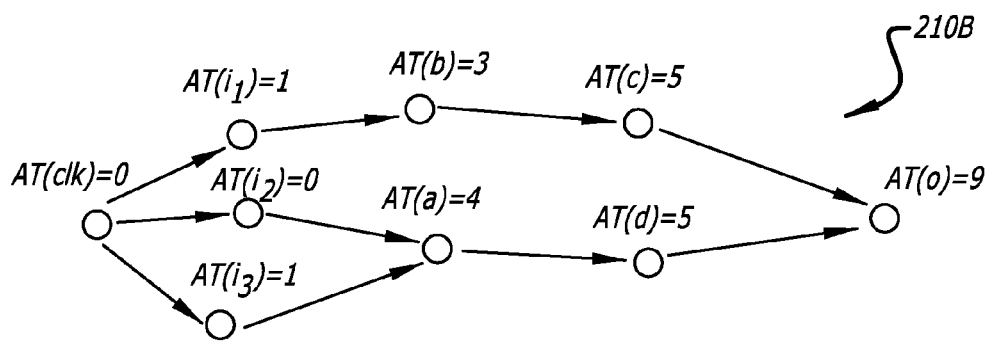
FIG. 2B illustrates a timing graph for the exemplary circuit of FIG. 2A.

Traditional methods of STA may be used with reference to the circuit 210A to form a timing graph 210B illustrated in FIG. 2B. For convenience, a single process parameter p in FIG. 2A may be normalized to vary inclusively within the range of negative one and positive one (−1 to 1).

Exemplary gate delays from input to output are shown by the arcs inside the gates and are functions of the process parameter p in the embodiments of the invention. For example, the gate delay of the inverter 201 as a function of the process parameter is 2+p. The gate delay between the first input and the output of the AND gate 202 as a function of the process parameter is 4+0.5p. The gate delay between the second input and the output of the AND gate 202 as a function of the process parameter is 3+p. The gate delay between the first input c and the output of the OR gate 203 as a function of the process parameter is 4+0.5p. The gate delay between the second input d and the output of the OR gate 203 as a function of the process parameter is 3+0.5p.

Exemplary interconnect delays are shown next to the nets between the gates as functions of p. For example, the interconnect delay between the output b of the inverter 201 and the input c of the OR gate 203 as a function of the process parameter is 2−0.5p. The interconnect delay between the output a of the AND gate 202 and the input d of the OR gate 203 as a function of the process parameter is 1−0.2p.

FIG. 2B illustrates a conventional timing graph 210B corresponding to the circuit 210A in FIG. 2A with the process parameter p being set to zero. The timing graph 210B is comprised of timing pins and timing arcs. Typically, the timing pins in a timing graph correspond to all interesting pins in the design. The arcs in a typical timing graph represent either connections within the cells and macro blocks from input to output or to wiring connections between pins of different cells or macro blocks.

The arrival times (ATs) in the timing graph 210B are propagated using the traditional STA methods for the nominal value of the process parameter where p=0. The arrival times (ATs) at each node of the timing graph is computed by adding the arrival time AT of a previous node with the arc delay through which the signal from the previous node has to propagate with p=0. This corresponds to the PROP operation used in conventional static timing analysis (STA). If there are more than one edge coming into the same timing node, a MAX operation is performed on two ATs to determine the worst case AT. For example, at the output a of the AND gate 202, there are two delay paths to node a. The arrival time at node a, AT(a) is the maximum arrival time between the two paths. In a first path propagating forward the arrival time AT(i2) to node a, the AT(a) is equal AT(i2) plus 4 which is equal to 0+4 or 4. In a second path propagating forward the arrival time AT(i3), the AT(a) is equal to AT(i3) plus 3 which is equal to 1+3 or 4. Had there been a difference between the two paths, the worst-case path would have been chose under the MAX operation. Using a conventional static timing analysis, the arrival time AT(o) at the output node o is equal to nine.

Arrival times are also modeled in statistical static timing analysis as functions of process parameters. However statistical static timing analysis, the arrival times are statistical arrival times (similarly, slack times are statistical slack times) in the form of probability density functions (PDF) or cumulative density functions (CDF) and are modeled using a first order parameterized form. Instead of determining a conventional maximum determination of two values, a statistical maxima of arrival times is determined from two PDFs or CDFs using their first order parameterized form. Instead of summing single values together, PDFs/CDFs are summed together using their first order parameterized form.

Figure 3A:
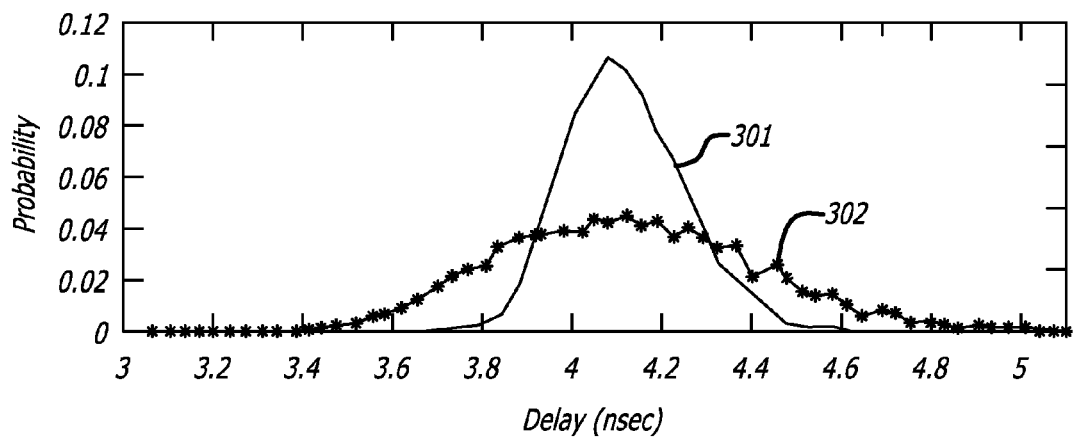
FIG. 3A illustrates exemplary probability density function curves 301-302 for delay at a node or gate.
Figure 3B:
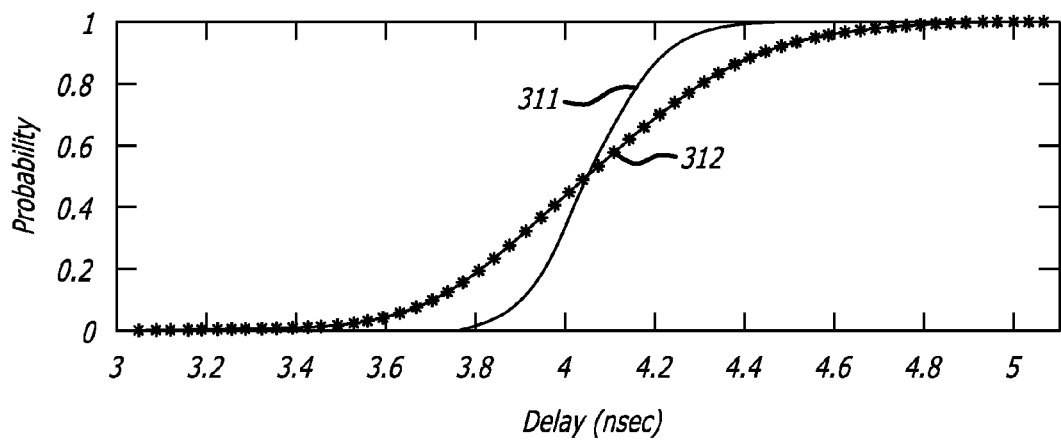
FIG. 3B illustrates exemplary cumulative density function curves 311-312 for delay at a node or gate.

Referring now to FIGS. 3A-3B, the delay times, the slew times, and the arrival times are respectively statistical delay times, statistical slew times, and statistical arrival times represented by probability density functions (PDF) or cumulative density functions (CDF) for SSTA, instead of single value numbers used in static timing analysis. In the timing graph, the PDF or CDF of the delay time, the slew time, and the arrival time for each node or pin in the timing graph is determined. Using a first order parameterized model of the PDF/CDF, sensitivities may be used to compute the PDF/CDF at any node of the timing graph.

FIG. 3A illustrates exemplary PDF curves 301-302 for delay at a node or gate. Other PDF curves may be generated for slew and arrival times at a point or gate. Curve 302 considers spatial correlation of random variables. Curve 301 entirely ignores any spatial correlation of random variables.

FIG. 3B illustrates exemplary CDF curves 311-312 for delay at a node or gate. Other CDF curves may be generated for slew and arrival times at a point or gate. Curve 312 considers spatial correlation of random variables. Curve 311 entirely ignores any spatial correlation of random variables.

A set of PDF curves or CDF curves for each node and gate of a circuit are generated for delay times, slew times, and arrival times as applicable. As the number of nodes or pins (also referred to as timing pins) in a functional block in an integrated may be high, the timing graph is simplified (e.g., reduced or pruned) so that it can be more readily analyzed by a processor in a computer. Moreover, the PDF/CDF curves may be reduced in order to further lower the number of computations made to perform statistical static timing analysis.

Graph reduction is performed by visiting and merging the delay arcs in a breadth first search (BFS) traversal order so that information is available for the next stage when the reduction methodology is to be applied there. That is, the methodology starts from the input pins and works its way down the hierarchy of the netlist from level to level.

While reducing the graph, to have a better path exception support, interface logic pins are retained if there is a path exception applied on that pin. Input and output ports of the block being extracted are kept as is and a chosen set of pins in the interface logic of the graph (e.g., latch/FF pins) are also preserved. Interface logic refers to the logic that is available between and up to the first sequential element reachable from the input/output port of the block. The input and output pins of a block and a few chosen sets of pins may be preserved.

When pins are preserved, the slew values coming from input delay arcs to the pin are used to compute delay across the arcs originating from the pin. Pins associated with output-to-output paths refer to all internal pins fed by a "net pin". A net pin is a pin which connects to a primary output ("PO") port via a net arc. This preservation is used to capture the correct output loading dependency on output-to-output paths and to account for the correct delay across net arcs.

When statistically merging timing arcs in timing graph, the timing arcs in the one or more worst-case delay paths are preserved. That is, the delay arcs in the worst-case delay paths are preserved in the circuit block and are not to be statistically merged.

There are various types of statistical merges that may be used to prune or reduce the timing graph for model extraction. There is a statistical serial merge (SS-merge) operation and a statistical parallel merge (SP-merge) operation. Moreover, the merge operation may be a forward merge (forward SS-merge) or a backward merge (backward SS-merge). The type of merge depends upon whether combinatorial or sequential logic is being analyzed. Moreover, there may be differences to what variables are considered—if die-to-die (D2D) variations are to be considered or if within die (WID) variations are to be considered.

Reducing Combinational Models

Figure 4A:
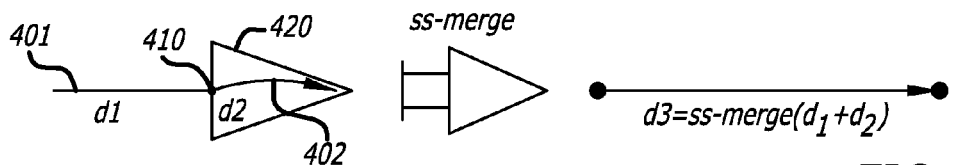
FIG. 4A illustrates a schematic of an inverter and input interconnect annotated with delay arcs.
Figure 4B:
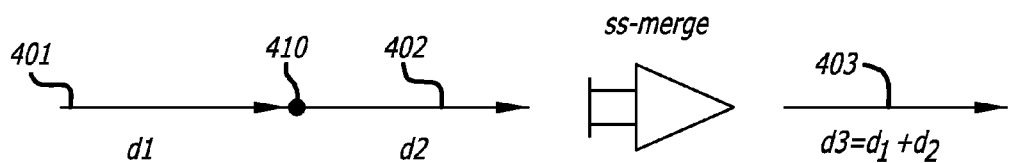
FIG. 4B illustrates an timing graph of FIG. 4A and a simple statistical serial merge (SS-Merge) operation.

Referring now to FIGS. 4A-4B, a simple statistical serial merge operation (SS-Merge) is illustrated by an inverter 420 forms a timing graph with the input arc 401 and the gate delay arc 402, for example. The statistical serial merge operation (SS-Merge) is performed by adding up two arcs (arc 401 and arc 402) having a common pin (410). The PDF/CDF of delays d1 and d2 for the arcs are summed together (d3=d1+d2) to get a PDF/CDF for the delay d3 of the merged arc 403. While the delays are only shown, any PDF/CDF of slew and/or arrival timing is similarly summed together to determine the timing for the merged arc 403.

The statistical serial merge (SS-merge) operation takes two delay arcs (d1 and d2) in series and creates a new arc (d3) from the source of the first arc (d1) to the sink of the second arc (d2) to represent the "sum" of d1 and d2. The SS-merge is a fundamental reduction operation that allows removal of internal pins from a timing graph without losing accuracy. When an SS-merge is performed, a new arc delay for the merged arc is computed. All of the delay arcs d1, d2 and d3 have their PDF/CDF represented using $1^{st}$ order parameterized models in order to reduce the mathematical complications of adding and subtracting PDFs or CDFs. The following represents the $1^{st}$ order parameterized models and the SS-merge operation computations:

If $$d1 = d1_0 + \sum_{i=1}^{i=n} d1_i \Delta X_i + d1_{n+1} \Delta R_a \quad (2)$$

and $$d2 = d2_0 + \sum_{i=1}^{i=n} d2_i \Delta X_i + d2_{n+1} \Delta R_a \quad (3)$$

then $$d3 = d3_0 + \sum_{i=1}^{i=n} d3_i \Delta X_i + d3_{n+1} \Delta R_a \quad (4)$$

where, $$d3_i = d1_i + d2_i \forall i \in [1,n] \quad (5)$$

Further, a "lazy" slew computation may be used so that output slew and arc delay are computed when new input slew values are received that would lead to changes in delay and output slew values. To further simplify computations, a load-dependent delay computation can be confined to the last arc that drives an output port. Thus, the location of an ark may be used to determine if additional delay computations will be made.

Figure 5:
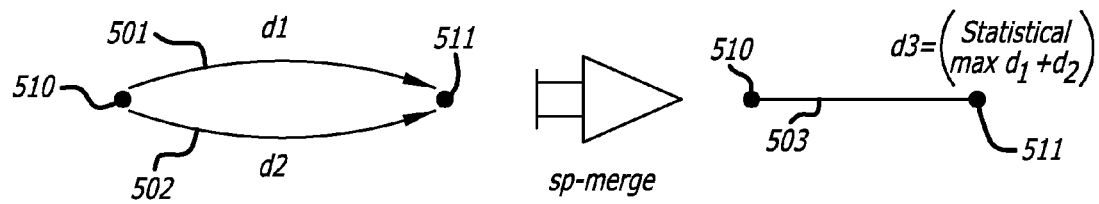
FIG. 5 illustrates a timing graph and a simple statistical parallel merge (SP-merge) operation.

Referring now to FIG. 5, a simple statistical parallel merge (SP-merge) operation is illustrated. In an SP-Merge operation, two arcs ending at same endpoint or converging points are merged to prune one away. A statistical parallel merge (sp-merge) operation takes two parallel arcs (501,502) and merges them into a single arc 503. The arcs 501,502 may be the result of inputs to a gate, such as gate 600 illustrated in FIG. 6.

The objective of a statistical parallel merge is to ensure that one or more worst-case delay paths are preserved and that there are fewer arcs to be processed for the next stage. In FIG. 5, two arcs (arc 501 and arc 502) with respective PDF/CDF delays d1 and d2 arise from the same point 510 and end at the same point 511 and are not within the worst case delay paths from input port to output port. As the arcs end at the same end point 511, a statistical parallel merge operation is applicable. The merger of arc 501 and arc 502 is a statistical MAX operation of a PDF/CDF and not a simple maximum value selection.

The delay d1 and d2 or arcs 501 and 502 are PDFs/CDFs and may be represented using a $1^{st}$ order parameterized model. The PDF/CDF delay d3 of the merged arc 503 may also be represented using the $1^{st}$ order parameterized model. The PDF/CDF delay d3 of the merged arc 503 is computed using the statistical MAX operation (Clark's formula) comparing the PDF/CDF delays d1 and d3 of arcs 501 and 502 respectively.

FIG. 6 illustrates the combination of an SP-merge operation with an SS-merge operation. The parallel arcs 501 and 502 may be merged as described previously. Then the resultant arc 503 may be SS-merged with arc 603 having a delay of d3.

The SS-merge and sp-merge operations can lead to a substantial reduction in the time to extract the statistical model as it reduces the number of arcs to be processed in the next stage of computations.

Reducing Sequential Models

Sequential models involve both delay arcs and check arcs. Check arcs can be classified into at least two main groups. One group is called the "setup" group where the data signal is expected to arrive before the reference or clock signal. The other group is the "hold" group where the data is expected to remain unchanged for a certain time after the active clock edge.

Associated with each delay arc is a transition matrix which defines valid transitions between the source pin and the sink pin. Associated with each check arc is a transition matrix which defines valid rising or falling transitions between the signal pin and the reference pin. Each check arc has a type such as setup, hold, recovery, removal, etc.

Referring now to FIG. 7A, an example timing graph for a sequential circuit (e.g., D-flip flop/register or latch) is illustrated. The timing graph includes a delay arc 702 represented as a solid-line arrow and hold and setup check arcs 704, 706 illustrated by dotted-line arrows.

Referring now to FIG. 7B, an example transition matrix for the CLK to Q delay arc 702 is shown. This matrix identifies transitional relationships between check arcs and delay arcs on input and output transitions. Delay/check values are associated with delay/check arcs. Delay or check values may be, for example, linear functions, lookup tables or delay equations. However, the delay/check values are PDF/CDF of each for SSTA.

To prune the timing graph of sequential circuits, registers or flip-flops are removed and part of the latch information is retained to preserve latch behavior. All latch input pins and latch output pins are retained. The operations associated with the removal of sequential elements are somewhat similar to those for statistical combinational models.

Figure 8:
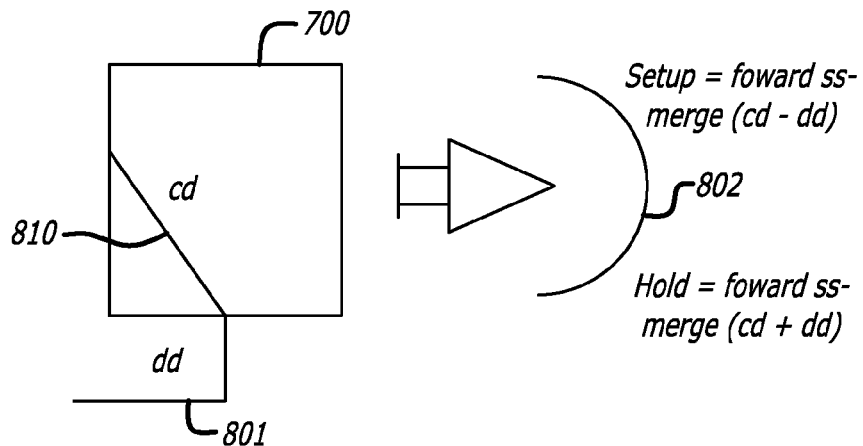
FIG. 8 illustrates a timing graph and a forward statistic serial merge (forward SS-merge) operation.

Referring now to FIG. 8, a forward statistic serial merge (forward SS-merge) operation is used when a delay arc 801 and a check arc 810 meet at a clock pin of a register or latch 700. In FIG. 7A, the check arcs 704,706 (between D and CLK) meet the delay arc 702 (between CLK and Q) at the clock pin CLK. The forward SS-merge operation is used when the register/latch clock pins are to be removed. This reduces the logic in the clock pin path.

In FIG. 8, a new check arc 802 is created to represent a new check value between the old data signal (signal end of the check arc 810) and a new clock signal (source of the delay arc 801). The new check arc 802 with new check values is to replace both the setup check arc and hold check arc. Assume cd is the statistical delay value of the clock signal in first order parameterized form and dd is the statistical delay value in first order parameterized form for the old data signal. With a forward SS-merge operation merging the two arcs (the delay arc 801 and the old check arc 810), a first new check value of the new check arc 802 becomes cd−dd and a second new check value of the new check arc 802 becomes cd+dd for the hold group. This represents the worst case for the setup time and the hold time. Note that the statistical delay/arrival time values of cd and dd are represented using a first order parameterized model to reduce the mathematical computations when adding/subtracting PDFs/CDFs together. The PDF and CDF of the delay may be constructed using the first order parameterized model.

Figure 9:
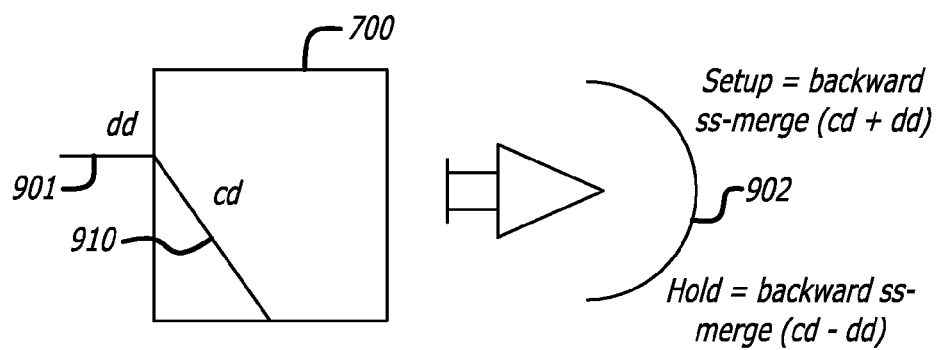
FIG. 9 illustrates a timing graph and a backward statistic serial merge (backward SS-merge) operation.

Referring now to FIG. 9, a backward statistic serial merge (backward SS-merge) operation is used when a delay arc 901 and a check arc 910 meet at a data pin of a register or latch 700. The backward SS-merge operation is used when register input pins are to be removed. This reduces the logic in the data pin path.

In FIG. 9, a new check arc 902 is created to represent a new check value between the source of the delay arc 901 and the old clock signal (reference end of the check arc 910). The new check arc 902 with new check values is to replace both the setup check arc and hold check arc. Assume cd is the PDF/CDF check value in first order parameterized form of the old check arc and dd is the PDF/CDF in first order parameterized form of the delay value of the delay arc 901. With a backward SS-merge operation merging the two arcs (the delay arc 901 and the check arc 910), a first new check value of the new check arc 902 becomes cd+dd for the setup group and a second new check value of the new check arc 902 becomes cd−dd for the hold group. This represents the worst case for the setup time and the hold time. The PDF/CDF of both cd and dd may be represented using the $1^{st}$ order parameterized models.

Figure 10A:
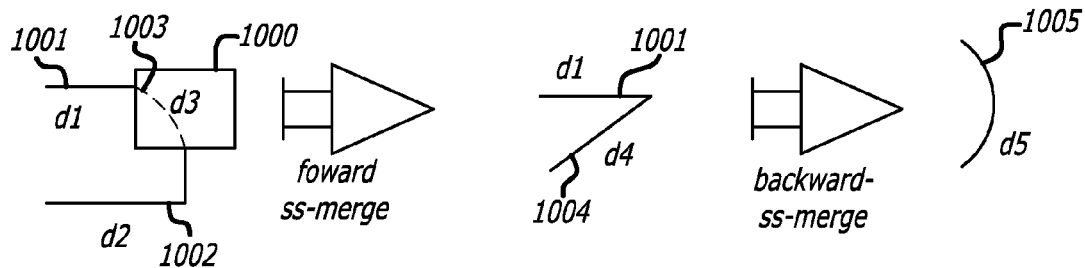
FIG. 10A illustrates a timing graph and a sequence of a forward SS-merge and a backward SS-merge on a sequential element.

Referring now to FIG. 10A, a sequence of a forward SS-merge and a backward SS-merge on a sequential element can lead to the generation of a new setup check. In FIG. 10A, a delay arc 1001 with delay d1 is connected to an input data pin of the register/latch 1000 and a delay arc 1002 with delay d2 is connected to the input clock port of the flip-flop/latch 1000. A check arc 1003 with a check value d3 is illustrated within the flip flop/latch 1000.

Assume that a forward SS-merge operation is first applied to the flip-flop/latch 1000 to reduce the logic in the clock pin path. In that case, the delay arc 1102 with delay d2 and the check arc 1003 with check value d3 are merged so that a new check arc 1004 with check value d4 is generated. Now the delay arc 1001 with delay d1 and the check arc 1004 with check value d4 can be merged using a backward SS-merge operation. The backward SS-merge operation merging the delay arc 1001 with delay d1 and the check arc 1004 with check value d4 results in a check arc 1005 with a check value d5.

Alternatively, a sequence of a backward SS-merge and a forward SS-merge on a sequential element can lead to the generation of a new setup check.

Figure 10B:
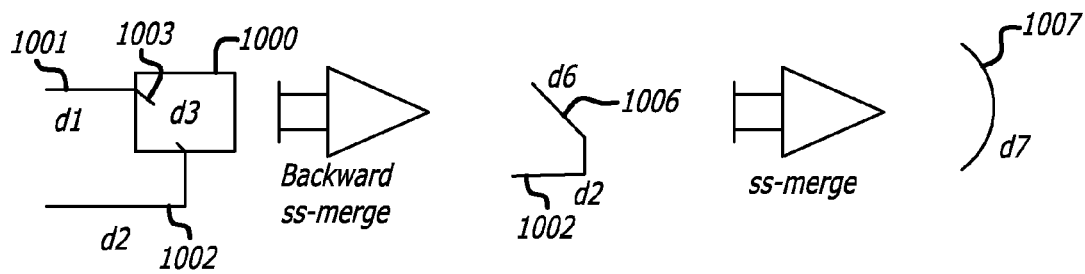
FIG. 10B illustrates a timing graph and a sequence of a backward SS-merge operation and a forward SS-merge on a sequential element.

Referring now to FIG. 10B, a timing graph and a sequence of a backward SS-merge operation and a forward SS-merge on a sequential element are illustrated. A backward SS-merge operation is first applied to the flip-flop/latch 1000 to reduce the logic in the data pin path. In this case, the delay arc 1101 with delay d1 and the check arc 1003 with check value d3 are merged so that a new check arc 1006 with check value d6 is generated.

Now the delay arc 1002 with delay d2 and the check arc 1006 with check value d6 can be merged using a forward SS-merge operation. The forward SS-merge operation merging the delay arc 1002 with delay d2 and the check arc 1006 with check value d6 results in a check arc 1007 with a check value d7.

These reduction techniques are used regardless of the type of process variations (e.g., D2D variations and/or WID variations) for which the model is being extracted. Specific information regarding extracting a model for D2D variations and WID variations is described below.

Load and Slew Range Considerations

Delay calculation is performed during SS-merge and SP-merge operations in which delays and sensitivities are computed over a fixed range of slew, load, and/or data values. For example, load ranges can be utilized for delay arcs which terminate at output ports. The ranges may vary from one delay arc or check arc to the other.

It is desirable to obtain accurate ranges of load and slew values. For table-based libraries, the ranges for load and slew values can be obtained as specified in library templates along with setup and hold times. However, ranges for load and slew values may not be available in library templates.

An approach to determining the slew/load ranges is to establish a tolerance value to specify a desired accuracy value for the range. A user may specify a tolerance value or a desired accuracy of the slew/load ranges. In this approach, every value in the initial range is evaluated to check if it can be dropped while meeting the desired accuracy level. Once a value is dropped from the range, the delay and the output slew values need to be interpolated using the points from its neighbors. If the interpolated delay and output slew values are within the specified tolerance limit, a value can be dropped from the range. The higher the tolerance percentage in this approach, the more values can be removed from the range. Signals outside the slew/load ranges are ignored as they are not expected to occur. With a tolerance and/or slew/load ranges, there is a reduction in the input slew values and the output load values to process.

Multiple Fan-in and Fan-Out Considerations

Input ports may lead to reconvergent data paths and this can create problems in a SP-merge operation if delay tables associated with the reconvergent paths have different slew ranges. Likewise, output ports may have multiple fanin paths arising from designs containing multiplexors. For this reason, it is appropriate to use the same slew range for all delay arcs and check arcs emanating from an input port and the same output load range for all delay arcs terminating at an output port. The ranges may differ from one input/output port to the other. To accommodate this, the slew (load) ranges are characterized for all delay arcs and check arcs which emanate from (terminate at) input (output) ports. Then, all the slew/load values are merged into a list for each input/output port. The merged list provides the widest range and then the model is characterized to get one or more tables of values.

Check Arc Considerations

The breadth first search (BFS) traversal order approach to analyzing the delay arcs in a timing graph ensures that all the input delay arcs to a pin have already been processed before the pin is removed. However, check arcs sometimes need special consideration. To completely characterize a check arc, a range of slew values should be available at both the signal end and the reference end. In some circumstances, the BFS traversal order of the delay arcs does not guarantee that both the signal end and the reference end of all check arcs are processed before a forward SS-merge operation or a backward SS-merge operation occurs with the check arc. Thus, check arc's in a data path may stall a merge operation in the data path until a greater number of values have been evaluated for the range of slew values available at both the signal end and the reference end of the check arc. The reference end of the check arc is the clock pin. The signal end of the check arc is the input pin of the register.

Model Writer

After the merge operations have finished, a model writer mechanism traverses or walks the reduced model graph to dump out the pins, the delay arcs and the check arcs in the desired format. Apart from standard delay model reduction, the delay and slew sensitivity information for each arc in the model are written out so that model is accurate for use in statistical static timing analysis (SSTA).

Constraint Generator

After extracting the statistical timing model, path exceptions are generated in a new manner for the extracted statistical timing model. The constraint generator also generates a set of constraints which are applicable when the statistical timing model is instantiated at a top level of the hierarchy of an integrated circuit.

Internal pins associated with constraints that are available in the interface logic of the pins are retained. Retention of internal pins allows the original assertions to be applied to the model with little to no modification, including assertions that span multiple blocks. Moreover, retention of the internal pins makes it easy to preserve and apply original timing constraints/assertions. The original timing constraints/assertions are viewed as part of the model such that a set of new constraints can be generated automatically as part of the statistical model extraction process. The original constraints/assertions are reduced to new constraints/assertions in response to the reduction performed on the timing graph in extracting the statistical timing model. Support of timing constraints is useful for top-down hierarchical design flows of an integrated circuit.

Extracting D2D models

As discussed previously, the arcs in the timing graph for the reduction of combinational models and sequential models are PDF/CDF of delay, slew, and arrival times for statistical static timing analysis. However, all of the PDF/CDF delay, slew and arrival time values may be represented using $1^{st}$ order parameterized models. The $1^{st}$ order parameterized models may be used to reduce the computations made during the SS-merge, SP-merge, and forward and backward SS-merge or SP-merge operations. Thus, the curves of PDF/CDF for delay illustrated in FIGS. 3A-3B may be reduced to first order parameterized models without loss of significant accuracy.

Reducing Combinational Models

The statistical s-merge (SS-merge) operation for combinational logic was previously discussed herein with reference to FIGS. 4A-4B. The SS-merge takes two delay arcs (d1 and d2) in series and creates a new arc (d3) from the source of the first arc (d1) to the sink of the second arc (d2) to represent the "sum" of d1 and d2. The SS-merge is a fundamental reduction operation that allows removal of internal pins from a timing graph without losing accuracy. When SS-merge is performed, a new arc delay for the merged arc is computed. With all of the delay arcs d1, d2 and d3 are represented using $1^{st}$ order parameterized models the following equations may be used with the SS-merge operation.

If $$d1 = d1_0 + \Sigma_{i=1-n}(d1_i \Delta X_i) + d1_{n+1} \Delta R_a$$

and $$d2 = d2_0 + \Sigma_{i=1-n}(d2_i \Delta X_i) + d2_{n+1} \Delta R_a$$

then $$d3 = d3_0 + \Sigma_{i=1-n}(d3_i \Delta X_i) + d3_{n+1} \Delta R_a$$

where,
$d3_0 = d1_0 + d2_0$
$d3_i = d1_i + d2_i$
and
$d3_{n+1} = d1_{n+1} + d2_{n+1}$ Further, a "lazy" slew computation may be used so that output slew and arc delay are computed only for new input slew values which can lead to changes in delay and output slew values. Also, the load-dependent delay computation can be confined to the last arc that drives an output port.

The statistical parallel merge (SP-merge) operation for combinational logic was described herein with reference to FIG. 5. The SP-merge operation takes two parallel arcs and merges them into a single arc. The delay of the merged arc is represented using the $1^{st}$ order parameterized model and is computed using the statistical MAX operation (Clark's formula).

To determine the MAX operator, Z=max(X, Y), Clark's equations in C. Clark, "*The Greatest of a Finite Set of Random Variables*," Operations Research, pp. 145-162, March 1961, derived the first and second moments of the distribution of max(X, Y) assuming X and Y are Gaussian as $$u_Z = u_X Q + u_Y (1-Q) + \theta P$$

$$\sigma_Z^2 = (u_X^2 + \sigma_X^2)Q + (u_Y^2 + \sigma_Y^2)(1-Q) + (u_X + u_Y)\theta P - u_Z^2$$

where
$\theta^2 = \sigma_X^2 + \sigma_Y^2 - 2\text{cov}(X,Y)$.

Note that P and Q are respectively the probability density function (p.d.f) and the cumulative density function (c.d.f) of the standard Gaussian distribution at $\lambda=(\mu x - \mu y)/\theta$ where $$P(\lambda) = \frac{1}{\sqrt{2\pi}} \exp\left(-\frac{\lambda^2}{2}\right)$$

and $$Q(\lambda) = \int_{-\infty}^{\lambda} P(x) dx.$$

An intuitive solution to the non-linear problem of MAX operator is to use a Gaussian PDF to approximate the MAX output such that the first two moments of the Gaussian PDF match those derived by Clark.

The SP-merge operation can lead to a substantial reduction in model extraction time as it reduces the number of arcs which need to be processed in the next stage of computation.

Reducing Sequential Models

Forward and backward SS-merge operations for sequential logic were previously discussed herein with reference to FIGS. 7A-10B.

Sequential models involve both delay arcs and check arcs. Check arcs can be classified into at least two main groups. One group is called the "setup" group where the data signal is expected to arrive before the reference or clock signal. The other group is the "hold" group where the data is expected to remain unchanged for a certain time after the active clock edge.

A forward SS-merge operation is used when register/latch clock pins are removed. When a delay arc and a check arc meet at a clock pin, a new check arc is created to represent a new check value between the old data signal (signal end of the check arc) and the new clock signal (source of the delay arc). Let d denote the delay value on the delay arc and c the check value on the check arc. When merging the two arcs for the setup group the new check value becomes c−d and for the hold group, the new check value becomes c+d where c is check arc value and d is delay arc value. The PDF/CDF of parameters c and d may be represented using the $1^{st}$ order parameterized models.

The backward SS-merge operation is used when register input pins are removed. When a delay arc and a check arc meet at a data pin, a new check arc is created to represent a new check value between the source of the delay arc and the old clock signal (reference end of the check arc). For the setup group, the new check value becomes c+d and for the hold group, the new check value becomes c−d. The PDF/CDF of parameters c and d may be represented using the $1^{st}$ order parameterized models.

Registers or flip-flops are removed and, part of latch information is retained to preserve latch behavior. All latch input pins and latch output pins are retained. The operations associated with the removal of sequential elements are similar to those for combinational models. Thus, the backward and forward SS-merge operations are addition or subtraction of the $1^{st}$ order parameterized models for c and d (or cd and dd as described herein earlier).

For example, consider the forward SS merge illustrated in FIG. 8 where the check value of setup is cd−dd.
If $$cd = cd_0 + \Sigma_{i=1-n}(cd_i \Delta X_i) + cd_{n+1} \Delta R_a$$

and $$dd = dd_0 + \Sigma_{i=1-n}(dd_i \Delta X_i) + dd_{n+1} \Delta R_a$$

then $$(cd-dd) = (cd-dd)_0 + \Sigma_{i=1-n}((cd-dd)_i \Delta X_i) + (cd-dd)_{n+1} \Delta R_a$$

where,
$(cd-dd)_0 = cd_0 - dd_0$
$(cd-dd)_i = cd_i - dd_i$
and
$(cd-dd)_{n+1} = cd_{n+1} - dd_{n+1}$ Extracting WID models The difference between D2D and WID variations is that the D2D variations for all the cells on a die may be fully correlated. In contrast, the correlation of the WID variations depends upon the location of the cell on the chip. The amount of correlation is an input that may be provided by the foundry service as part of its cell library and is provided to the SSTA engine.

In one embodiment of the invention, the integrated circuit die or chip is divided up into M×N grids. The process parameter(s) of each grid is modeled as a separate random variable. To account for the WID variations with the separate random variable, the various merge operations using $1^{st}$ order parameterized models are modified in the following manner:

For a statistical serial merge (SS-merge) operation, if two cells whose sensitivities need to be merged are in different grids with a co-efficient of correlation σi for a process parameter Xi, then the result of the serial merge is computed as
If $$d1 = d1_0 + \Sigma_{i=1-n}(d1_i \Delta X_i) + d1_{n+1} \Delta R_a$$

and $$d2 = d2_0 + \Sigma_{i=1-n}(d2_i \Delta X_i) + d2_{n+1} \Delta R_a$$

then $$d3 = d3_0 + \Sigma_{i=1-n}(d3_i \Delta X_i) + d3_{n+1} \Delta R_a$$

where,
$d3_0 = d1_0 + d2_0$
$d3_i = \sqrt{d1_i^2 + d2_i^2 + 2 \sigma_i d1_i d2_i}$ and
$d3_{n+1} = d1_{n+1} + d2_{n+1}$.

The above formula can be readily modified to find the difference between two numbers in the parameterized form, where $d2_k$ is replaced with $-d2_k$, as follows:
If $$d1 = d1_0 + \Sigma_{i=1-n}(d1_i \Delta X_i) + d1_{n+1} \Delta R_a$$

and $$d2 = d2_0 + \Sigma_{i=1-n}(d2_i \Delta X_i) + d2_{n+1} \Delta R_a,$$

then $$d3 = d3_0 + \Sigma_{i=1-n}(d3_i \Delta X_i) + d3_{n+1} \Delta R_a$$

where,
$d3_0 = d1_0 - d2_0$
$d3_i = \sqrt{d1_i^2 + d2_i^2 - 2 \sigma_i d1_i d2_i}$
and
$d3_{n+1} = d1_{n+1} - d2_{n+1}$.

Validation of S-ETM

A validation technique of the S-ETM is a two-step process. At a broad level, the statistical timing model can either be validated on an arc basis or on a slack basis. In the case of validation based on arcs, the effect of constraints doesn't play a role and the statistical model is deemed more context independent. In case of a validation based on slacks, the validation technique compares the model based on slacks. In this case, the constraints (e.g., path exceptions), are used during validation and usage of the statistical model.

The first step in validating involves generating a reference view for the S-ETM by performing statistical timing analysis on a block and generating a total delay and or slack for each arc that would be extracted into the timing model. A validation package may be used for extraction into the timing model. For each pin/port in the interface logic of the block, the capacitances, the transition times and the design rule violations, if any, are extracted. This set of data becomes a reference for model validation. A model extractor writes out a netlist that contains the primary ports and S-ETM instantiated and constraints for the statistical model.

The second step uses the netlist information for the block to load the S-ETM and perform statistical timing analysis. Data extracted with the original netlist is extracted again with the model.

A utility work script written in a scripting language, such as the tool command language (TCL, that is pronounced "tickle"). is then used to compare data for each delay arc and or slack, the capacitances, the transition times and the design rule violations, if any. If these parameters are comparable within a given threshold, the extracted model is considered to be fit for use in performed statistical static timing analysis.

Methods of Statistical Model Extraction

Figure 11A:
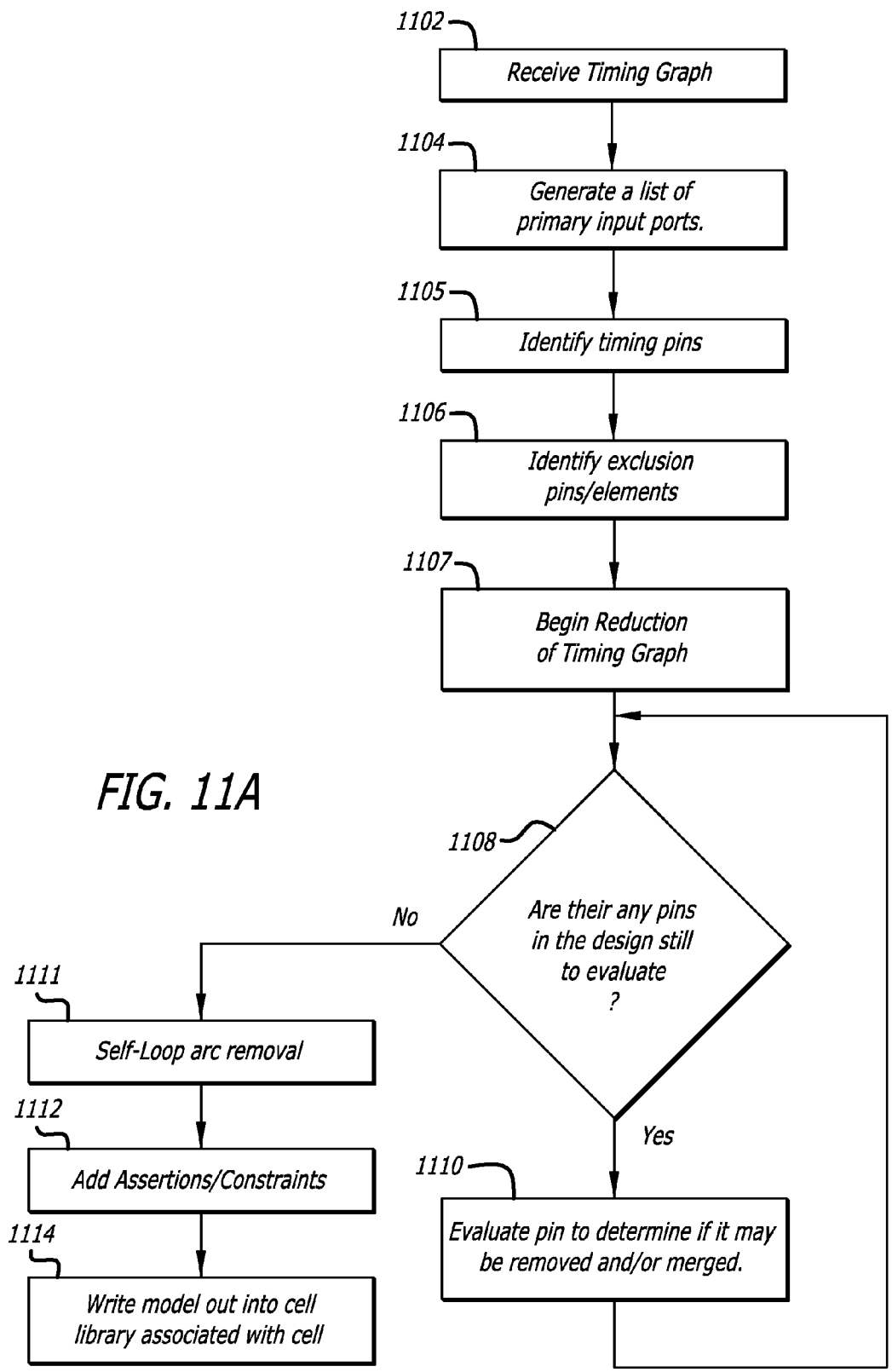
FIG. 11A is a flowchart of a process for implementing extraction of a statistical timing model.

Referring now to FIG. 11A, a method of statistical model extraction is illustrated for the analysis of a circuit design.

At process element 1102, a timing graph is received for a block of a circuit design for which a statistical timing model is desired. The timing graph may be generated by a static timing analysis tool. The process then goes to process element 1104.

At process element 1104, a list of the primary input ports is generated from the timing graph. The timing graph reduction process begins from the primary input ports of the circuit block. The process then goes to process element 1105.

At process element 1105, an identification is made of the timing pins within the timing graph. The process then goes to process element 1106.

At process element 1106, an identification is made of the timing graph pins/elements within the timing graph of the circuit block to exclude from a reduction process.

Examples of pins/elements to possibly exclude from reduction include anchor points, latch points, and assertion points. Anchor points are pins for which the model graph would become larger than the original timing graph, if it was eliminated. Latch points are pins excluded from reduction to ensure preservation of latch behavior of a latch element. Examples of excluded latch points include the input and output pins of a latch element. The one or more clock pins of a latch element need not be an excluded latch point. Common path pessimism reduction (CPPR) points for which common clock path pessimism is computed statically during grey box statistical timing model extraction are also preserved and excluded from reduction. Pins associated with an assertion or a timing constraint, referred to as assertion points, are also excluded from reduction to preserve and apply the original constraints.

After identification is made of timing pins to process (element 1105) and of timing graph elements to exclude from the model reduction action (element 1106), a reduction of the timing graph may occur. The process goes to element 1107.

At process element 1107, a timing graph reduction process starts from the primary input ports. The timing graph reduction process moves from the primary input ports towards the one or more output ports of the block of the circuit under analysis.

At process element 1108, a determination is made if there are any pins in the design of the circuit block to evaluate. If so, the process goes to process element 1110.

At process element 1110, assuming there are pins remaining in the design, a pin is evaluated to determine if it can be removed or merged out of the timing graph. The removal of a pin can be achieved by using one or more of the statistical merge operations—statistical serial (SS) merge operation, statistical parallel (SP) merge operation, forward SS-merge, backward SS-merge, and/or combinations thereof. Exemplary statistical merge operations were previously described herein with reference to FIGS. 4A-10B.

After a pin is removed or merged out of the timing graph, the process goes back to process element 1108.

If it is determined at process element 1108 that no further timing pin is left to evaluate, the process goes to process element 1111.

At process element 1111, self loop arcs are cleaned up during this model extraction process. A self loop arc occurs when the reference pin and the signal pin of a check arc are the same and the timing check are the same. Cleaning up a self loop arc is performed by determining whether or not the timing check for a check arc being extracted is different from min_period or min_pulse width and whether or not the reference pin and the signal pin of the check arc are the same. If this is the case, the self loop arcs are removed from the statistical timing graph and ignored during model extraction so they are not included in the extracted timing model. For example, if the check arc is a signal arc with reference pin and source pin being same and it is also that case that the reference pin and source pin is a clock pin, a self loop arc exists. The self loop arc is cleaned up by removing this check arc that is a self loop arc from the statistical timing graph. After the self loop arcs are removed, the process then goes to process element 1112.

At process element 1112, assertions/constraints are added to the reduced timing graph. The assertions/constraints may be automatically generated as further described herein. After generation of the assertions/constraints, the statistical timing model is written out for inclusion in a library associated with the block or cell at process element 1114. A model writer is called to dump or write out the statistical model for the circuit block into a technology library (.lib) file.

Figure 11B:
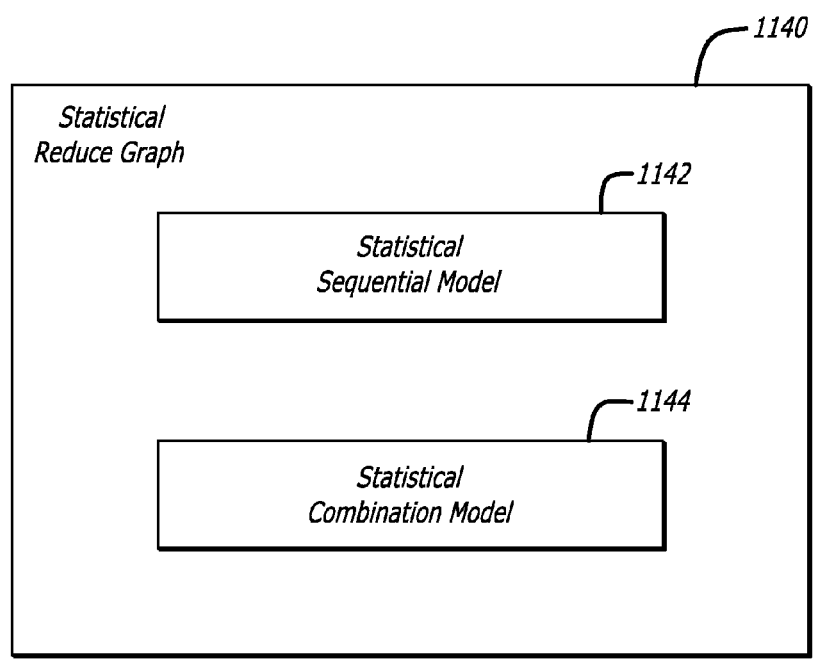
FIG. 11B shows a flowchart of a process for graph reduction.

Referring now to FIG. 11B, a block diagram of a statistical timing graph model 1140 formed by the reduction process 1110 is illustrated. In process element 1110, the timing graph is processed for possible reduction, except with respect to the elements and pins identified for exclusion.

The statistical timing models 1140 that are extracted by the process element 1110 are divided into at least two parts comprising a combinational part and a sequential part. The combinational part of the statistical timing model 1140 represents the interaction among delay arcs and is captured in the combinational statistical timing model 1144. The sequential part of the timing model represents the interaction between the delay arcs and the check arcs and is captured in the sequential statistical timing model 1142.

Self loop arcs are cleaned up during model extraction. A pair of self loop arcs occurs when a pair of check arcs has the reference pin and signal pin being the same and the timing checks being the same. Cleaning up a self loop arc is performed by determining if for a check arc being extracted whether or not the timing check is different from min_period or min_pulse_width and the reference pin and signal pin of the check arc are the same. If yes, the arc is ignored. For example, if the check is a signal arc with reference pin and source pin being same and the reference pin and source pin are a clock pin, a self loop arc exists and it is cleaned up by its removal from the statistically reduced timing graph.

The pins and arcs in the timing graph are processed with BFS (breadth first search) ordering.

Multiple iterations of the reduction process may be performed to all or part of a timing graph until no further pins remain for processing (1108).

The statistical timing model 1140 that is extracted has delay and slew sensitivity information for each delay arc that is absent in a statically extracted model. The delay and slew sensitivity information is made available by using a statistical timing analysis system which can statistically analyze a circuit design and generate a statistical timing model by reducing the timing graph annotated with statistical information.

A number of advantages may be found in using a statistical timing model with statistical timing analysis tools. Static timing analysis tools typically do not handle issues arising from process variations. As design technology moves toward deep submicron feature sizes (e.g., 65 nm and below), the effects of process variations become more pronounced and may cause logic failures if care is not taken to evaluate the timing of integrated circuit designs with respect to process variations.

The variation aware timing model (e.g., a statistical timing model) disclosed herein can substantially reduce the time spent by multiple design teams working on parallel design blocks and can decrease the time it takes to achieve overall timing closure of an entire integrated circuit (chip) design.

Automated Constraint Generation for Abstracted Timing Models

Timing behavior abstraction performs the role of a backbone for a hierarchical design flow. Abstracted timing models are based on the theme of using a timing interface of a hierarchical module instead of using the actual implementation of the module. The generation of an abstracted timing model is typically performed to reduce the memory requirements that otherwise may be needed to determine the timing for a complex integrated circuit and reduce the run-time of the timing validation cycle to speed up the design process. An abstracted timing model can also be used to hide the implementation details of reusable intellectual property (IP) circuit blocks that may be licensed to customers by an IC design company.

Figures 15A, 15B:
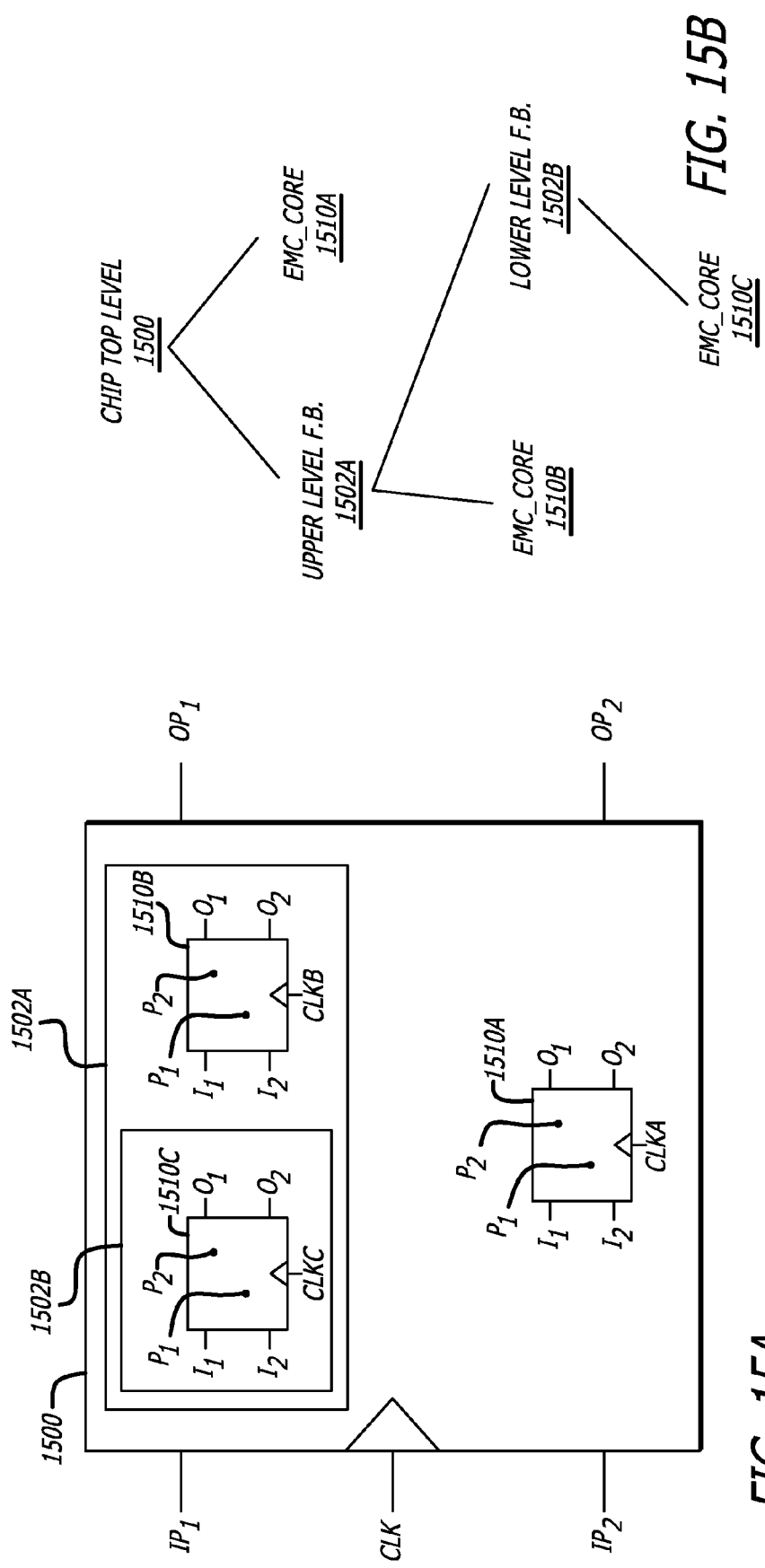
FIG. 15A is a block diagram of an exemplary hierarchy in an integrated circuit design.
FIG. 15B is a tree diagram illustrating the instantiation of blocks in the exemplary hierarchy in the integrated circuit design of FIG. 15A.

FIG. 15A illustrates a block diagram of an exemplary integrated circuit design 1500 having a clock generation port CLK, input ports IP1-IP2, and output ports OP1-OP2. The integrated circuit design 1500 is a top chip level 1500 with one or hierarchical levels of functional blocks 1502A-1502B, and one or more instantiations of a circuit block 1510A-1510C at the various levels of the functional block hierarchy.

FIG. 15B illustrates a tree diagram of exemplary hierarchy of the integrated circuit design 1500 from the top chip level 1500 to the circuit blocks 1510A-1510C and lower level functional blocks 1502A-1502B. At a level below the top chip level 1500 there may be an upper level functional block 1502A and a first instantiation of a reusable IP circuit block (emc_core) 1510A. At the next level in the tree diagram, there may be a second instantiation of the reusable IP circuit block (emc_core) 1510B and a lower level functional block 1502B. At the lowest level of the tree diagram, there may be a third instantiation of the reusable IP circuit block (emc_core) 1510C along with other instantiated circuit blocks or cells.

The circuit blocks 1510A-1510C may have their own clock generation port CLKA-CLKC, their own input ports I1-I2, and their own output ports O1-O2. Each of the instantiated circuit blocks 1510A-1510C may have one or more internal pins P1-P2 that can assist in validating the circuit at the chip top level and/or self validation of the circuit block itself.

For reusable IP circuit blocks (also referred to as reusable IP cores), the IC design industry typically uses a black box model for description of the circuit behavior. That is, the input and output interfaces to the IP circuit block are defined but no further information regarding the internal portions of the circuit can be inferred there-from. Black box models have limitations such as lack of preserving clock independent latch behavior, a possible blow up of model size, and limited assertion/constraint support. To avoid some of the drawbacks and limitations with black box models, grey box models are becoming more popular to use in defining IP circuit blocks in the IC design industry.

A statistical timing model of a circuit block can be a black box model or a grey box model. For grey box models, additional pins are also preserved, such as common clock path pessimism points.

Grey box models are based on the theme of preserving some internal pins of the circuit for analysis. For example, the circuit blocks 1510A-1510C may be modeled using a grey box model with preserved internal pins P1 and P2 being used for analysis/application of design constraints. Thus, an automatic constraint generation flow (for stand alone validation as well as top level netlist stitching) for abstract models, such as a grey box model, becomes important.

The abstracted model should be validated for timing before it is transferred to another team/designer for use in a top level analysis of the integrated circuit or optimization flow. For validation purposes, a first subset of the original timing constraints may be used and a second subset of the first subset of constraints may be used for fitting the model into a top level netlist of an integrated circuit design.

The original constraint set may not be used in its original form with an abstracted model as the abstract model is instantiated within a different high level description of an integrated circuit design (e.g., Verilog module) with different pin/port names. For example, consider a create_clock constraint within an original constraint list such as
create_clock-name clk-period 10 [get_pins A/B]

While abstracting the design, the A/B pin is retained as an internal pin to the abstracted model with the name of the pin changing to "clk". The original constraints associated with the A/B pin name cannot be used without modification. The target pin name (A/B) in the constraint needs to be changed so it is associated appropriately with the pin name of the instantiated model. For example, the original constraint may be modified with a prefix to
create_clock-name clk-period 10 [get_pins abs_ins/clk]

There are some constraints in the original constraint list which become invalid for the abstracted model. Consider a path exception constraint such as the following:
set_false_path-from clock1-through A/B-to clock2

This constraint becomes invalid for an abstracted model as names of though pins on a through list of exceptions (e.g., through A/B) needs to be modified for each instantiated model. There are scenarios when a software IC design tool needs to retain the pin name, such as when there are multiple instantiations of a circuit block or cell block in an integrated circuit with the same clock pin name. The instances of a circuit block or cell block in an integrated circuit may occur at different levels of circuit hierarchy. For example, a circuit block may be instantiated at the top level hierarchy or one or more level downs in the hierarchy of an integrated circuit. In such cases, the name of a through pin (e.g., through A/B) should be modified such as inst/A/B or inst1/inst2/A/B.

It is desirable to provide automatic constraint generation into a design constraint file for validation of the abstracted models instantiated into an integrated circuit design. It is desirable to formulate a circuit design flow that enables automated generation of modified constraints for abstracted models.

Figure 13:
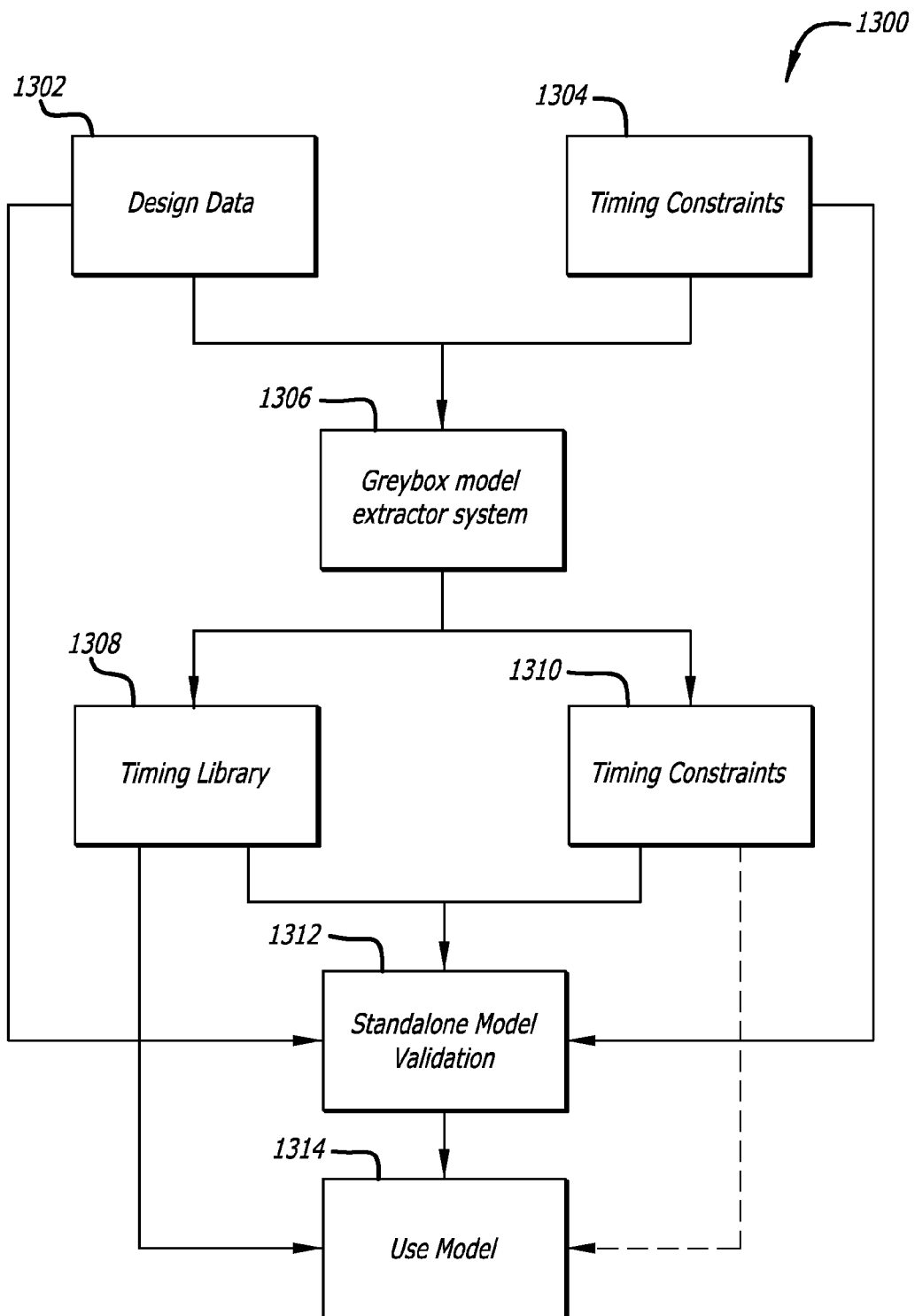
FIG. 13 is a flow chart of an exemplary design flow of automatic constraint generation for abstract models.

Referring now to FIG. 13, a circuit design flow chart 1300 is illustrated to support the automatic generation of modified constraints for abstracted models. Original design data 1302 including one or more circuit blocks and an original constraint file 1304 for an integrated circuit are received by a grey-box model extraction system 1306. The model extraction system 1306 generates abstracted models of the one or more circuit blocks and writes the abstracted model including associated statistical timing graphs out into a timing library file 1308. The model extraction system 1306 further generates the timing constraints 1310 and writes them out into two constraint files 1312,1314 containing subsets of the original constraint 1304. One of the constraint files (stand-alone validation constraint file) 1312 is used for standalone validation of the model compared to the original netlist. The other constraint file (use model constraint file) 1314 is used when the abstracted model of a circuit block is stitched or instantiated into an upper level or the top level netlist of a larger integrated circuit design.

The two separate constraint files 1312, 1314 are formed because (i) for a stand alone validation, all the context parameters of the design are automatically generated; and (ii) for statistical timing analysis (STA) or optimization flow when stitched to a top level environment, the context parameter automatically comes from the top level of the integrated circuit design. Thus, for each of these constraint files, there is some filtering and modification of the original constraints. The disclosed automated constraint generation procedure executed during model extraction for each circuit block performs the filtering and modification of the original constraints for the abstracted statistical timing model for the stand alone validation constraint file and the top level STA constraint file.

To gain an understanding of the automated generation of constraints for grey box model abstraction, an exemplary design flow and exemplary circuit with exemplary constraints are described herein. Various possible scenarios for design constraints for a grey box model are introduced with explanations as to why or why not they may be needed and how they may be dumped or written out into one, both, or neither of the two constraint files.

Referring now to FIG. 14A, an exemplary circuit design 1400 is illustrated. The circuit design 1400 includes buffers buf1-buf7 1402A-1402G, D flip-flops ff1-ff2 1402A-1402B, a latch Lat1 1406, an AND gate and 1 1408, and a clock divider Clk_divider 1410 coupled together as shown.

FIG. 14B illustrates exemplary constraints 1450 for the exemplary circuit design 1400 illustrated in FIG. 14A. The exemplary constraints 1450 for the exemplary circuit design 1400 includes three path exceptions 1453-1455, two clock definitions 1451-1452, and some boundary constraints 1456-1461.

For instantiation of a grey box into an upper level or the top level design, pins within path exceptions and pins having clock definitions associated with them should be preserved.

For example in the path exceptions 1454-1455, the set of pins {buf3/A, buf3/Y, lat1/Q, and 1/B, and 1/Y} are preserved. However, the pins {lat1/Q, and 1/B, and 1/Y} are internal pins which do not contribute to any interface path (e.g., direct input to register (in2reg), register to output (reg2out), and input to output (in2out)). Thus, the pins {lat1/Q, and 1/B, and 1/Y} may be trimmed by the model extractor and need not be dumped or written out as a constraint into a constraint file associated with these pins.

After analyzing the path exceptions 1454-1455, there is 1 path exception 1453, 2 clock definitions 1451-1452, and other boundary constraints to analyze and dump or write out into two constraint files 1308, 1310 for stand alone validation and top level netlist analysis, respectively.

The generated_clock definition 1452 may be dumped into the model itself. The case analysis constraint 1461 may be considered during the model extraction process itself. The two exemplary constraint files 1308,1310 associated with the constraints 1450 may be written out as
Standalone Validation Constraints 1310:
if {! [info exists ETM_CORE]} {
    set ETM_CORE abs_inst
}
create_clock-period 10-name clk [get_ports clk]
set_multicycle_path 2-from [get_ports in]
set_false_path-through [get_pins [list $ETM_CORE/buf3/A]]-through [get_pins [list $ETM_CORE/buf3/Y]]
set_input_delay 1.5 [get_ports in]
set_input_delay 1 [get_ports in1]
set_output_delay 1.2 [get_ports out]
set_input_transition 0.120 [get_ports in]
set_input_transition 0.120 [get_ports in 1]
Top level Constraints 1308:
if {! [info exists ETM_CORE]} {
    set ETM_CORE abs_inst
}
set_multicycle_path 2-through [get_pins [list $ETM_CORE/in]]<<←-*
set_false_path-through [get_pins [list $ETM_CORE/buf3/A]]-through [get_pins [list $ETM_CORE/buf3/Y]]

Pre-appending the new hierarchy name to pin names is achieved by using a variable ETM_CORE. This can be set to any value depending on the top level netlist where the abstracted model is to be stitched or instantiated. Note that the ports are mapped to their respective pin for the top level analysis and change-from/-to to-through. Also in the top level constraint file, the boundary constraints are written as if they are supposed to come from the top level environment.

Path Exceptions

Generally, path exceptions contain set_false_path and set_multicycle_path constraints such as constraints 1454-1455 and 1453, respectively. The philosophy of retaining such constraints applies equally to both types of path exceptions. How these constraints are modified and dumped or written out into the constraint files is now described.

Path Exceptions with -from/-to Port:

Path exceptions of the type-from [get_ports . . . ]/-to [get_ports . . . ]/-from [get_ports . . . ]-to [get_ports . . . ] need no modification as the port names are not changed while extracting a model. Thus, the grey-box extractor 1306 preserves timing arcs in the extracted library and dumps these original exceptions in the generated constraint file. Such exceptions are dumped or written into both constraint files 1308, 1310 (i.e. for standalone validation as well as the top level static timing analysis (STA).

Path Exceptions with -from/-to/-Through Pin:

Path exceptions of the type -from [get_pins . . . ]/-to [get_pins . . . ]/-through [get_pins . . . ] or any combination of such -from/-to/through pin condition require modified pin names. The pin names are modified by prefixing them with the instance name. Prefixing the instance name to the pin name is achieved with a TCL construct such as
if {! [info exists ETM_CORE]} {
    set ETM_CORE abs_inst
}
[get_pins [list $ETM_CORE/pin1 $ETM_CORE/pin2 $ETM_CORE/pin3]]

A default value ETM_CORE is initially set for the instance name. The default value may be later changed to the module name that is instantiated into the top level of the circuit design. If it is instantiated more than once, a block will be instantiated with different names. Using a TCL variable ETM_CORE as the initial instance name provides flexibility to the user to set it to any new value.

In the case of a path exception applied to a hierarchical pin, the extractor 1306 creates an extra pin in the library (pin_HIER) and links it combinationally to a leaf pin using a zero delay arc.

Path Exceptions with -from/-to Clock

Path exceptions of the type -from [get_clock . . . ]/-to [get_clock . . . ]/-from [get_clock . . . ]-to [get_clock . . . ]. that contain the clock as the object list need not be modified because the clock name will remain the same in the extracted model when stitched into the top level netlist. Thus, these exceptions are dumped or written as is into both constraint files.

Set_Disable_Timing Constraints

The set_disable_timing constraints are handled in the timing graph itself, as the timing delay arcs being disabled are not used for extraction purposes. As the Set_disable_timing constraints are abstracted in the model itself, there is no need to modify or handle these types of constraints so they are not dumped or written into any constraint file.

Set Case Analysis Constraints

The set_case_analysis constraints are handled like the set_disable_timing constraints. The constant values associated with set_case_analysis constraints are handled during model extraction. All the arcs connected to such pin/ports behave like a disabled arc. Thus, the set_case analysis constraints are not dumped or written into either of the two constraint files.

Clock Definitions

A circuit may have clocks defined by a create_clock statement or a create_generated_clock statement, such as statements 1451-1452 for example.

Create_Clock

The pins/ports having create_clock definition associated with them are preserved in the timing model. If a clock is created on some internal pin then the pin name needs to be modified to reflect the instance name of the extracted model. This may be achieved by using a TCL variable approach. An exemplary TCL script for modifying the pin name is as follows:

[get_pins [list $ETM_CORE/pin1 $ETM_CORE/pin2 $ETM_CORE/pin3]]

When the extracted model is stitched to a top level netlist of the integrated circuit, the clock definitions are typically from the top level netlist itself. Thus, the clock definitions are not usually dumped or written into a top level constraint file.

Create_Generated_Clock

Pins with the create_generated_clock defined on them are preserved in the extracted model as internal pins. As generated clocks are very much intended for the block itself and are not supposed to come from an upper or top level, a syntax is provided to define the generated clocks in the timing model itself. An exemplary format in which the generated clocks are preserved in the model is as follows:

generated_clock (gclk) {
   clock_pin: gclk;
   master_pin: clk;
   multiplied_by: 2;
}

While loading a model tool (e.g., Cadence Design Systems, Inc.'s ENCOUNTER and SoC ENCOUNTER timing systems) initially names generated clocks after their target pin name, when dumping or writing the generated clocks into the library 1308, the target pin name is modified to the clock name itself. With this modification, the generated clock name is the same name used in original netlist and the extracted model.

Thus, there is no need to dump or write out the generated clocks as a separate constraint. Additionally, modifying the pin name in this manner for a generated clock, reduces the need to modify other constraints (e.g., clock uncertainity/path exceptions) related to the generated clock.

Arrival Time and Required Time Constraints

The required time constraints and arrival time constraints for signals, such as like set_input_delay and set_output_delay, may be applied on ports as well as some internal pins. Such constraints applied on some internal pins are nonsensical for an extracted model. This is because in an extracted model the interface timing is of interest.

Constraints applied on the ports need not be modified as the port is to be preserved with the same name. So the required time constraints and arrival time constraints are dumped or written out in the constraint file as is. However, required time constraints and arrival time constraints need not be dumped or written out into the top level constraint file. This is because at the top level of the hierarchy of the integrated circuit design, the data driven onto the port is from some other top level register or port. So the input delay value of a set_input_delay constraint is the delay of a path from a top level register/port to this port. Similarly, the output delay value of a set_output_delay constraint is the delay of a path from a top level register/port to this port.

Global Constraints

One or more global constraints may be set for each and every pin. Examples of global constraints may be set max_transition to set a global constraint on the maximum transition time or set max capacitance to set a global constraint for the maximum capacitance on each pin.

The abstracted model may itself provide a format that supports these global design rule validation (DRV) rules. Thus, these global constraints may be dumped or written out into the timing model itself and annotated to the pins with the pin attributes "max_transition" and "max_capacitance". Thus, these global constraints need not be dumped or written out as a separate constraint into either constraint file.

Pin and Port Constraints

Some constraints may be applied to both pins and input/output ports of a circuit block. Exemplary Pin/Port constraints are set_load; set_resistance; and set_annotated_transition. These constraints can be applied on the pins as well as the ports. Such constraints may be applied on the internal pins and can be handled in the extraction flow itself during delay calculations. Thus, these constraints are included in the model. However when these constraints are applied to the ports, they are treated out of context and are dumped or written out into the constraint file. By dumping or writing out only the port constraint into the constraint file, nothing needs to be changed with these constraints. That is, when the constraints are being applied to the ports, they are dumped or written out as is into the constraint file. However, the pin/port constraints need not be dumped or written into a top level constraint file if they are to be applied directly by an interactive constraint application. Alternatively, they may be written into the top level constraint file if referenced by the top level environment.

Annotated Delay Constraints

An annotated delay constraint instantiated by the instruction set_annotated_delay may be applied onto an internal arc as an incremental value or an absolute value Annotated delays are handled in the extraction flow itself during delay calculations. Thus, annotated delay constraints can be included in the model itself and thus an annotated delay constraint need not be dumped or written out to any constraint file.

Port Only Constraints.

Port only constraints, such as set_input_transition or set_driving_cell constraints, are out-of-context environmental constraints and applied on ports only. As the ports are included in object list for these constraints we need not modify anything for such constraints when extracting the timing model. Additionally, these port only constraints are not dumped or written into the top level constraint file. Constraints to be dumped or written into the top level constraint file 1314 for a top level are constraints associated with the top level environment of the circuit block.

Application of Automated Constraint Generation

The design method described herein facilitates an automatic method of generating modified constraints for the extracted timing model. The design method can be applied in the validation flow of an integrated circuit design with abstracted models of circuit blocks being seamlessly stitched into the top level netlist of an integrated circuit design with constraints written into the top level constraint file 1314.

Manual edits of the constraint file may be performed to generate the constraint files for the abstracted models. Alternatively, TCL scripts may be manually written to form the constraint files for the abstracted models. To manually form the constraint files, a manual check for pins is made in the original constraint file and its existence verified in the abstracted model. If the pin is present in both the abstracted model and the original constraint file, then the pin name of the abstracted model is modified into the new hierarchy. If a pin in the original constraint file is absent from the abstracted model, then a check is made to determine if the constraint is still valid for other pins (there may be multiple pins associated with a constraint) in the abstracted model. If not, the original constraint can be filtered out and not written or dumped out into either constraint file.

However, manual editing or writing scripts to generate the constraint files for abstracted models may be difficult if the integrated circuit design is large with multiple levels of hierarchy and instantiation of one or more abstracted models of circuit blocks. Instead, the method of automatic constraint generation disclosed herein can be embedded as part of the model extractor system 1306.

Moreover, validation of an abstracted model in a large integrated circuit design is difficult unless it is somewhat automated. The method of automatic constraint generation disclosed herein provides an automated constraint generation mechanism to validate abstracted models in the validation flow of the integrated circuit design.

While grey-box abstract modeling was used to describe the automated constraint generation design flow, with minor changes, the automated constraint generation may be embedded into almost any type of model abstraction approach, such as a black-box model abstraction, an interface logic model (ILM) abstraction, or a crosstalk interface logic model (XILM) abstraction.

Computer System

Figure 12:
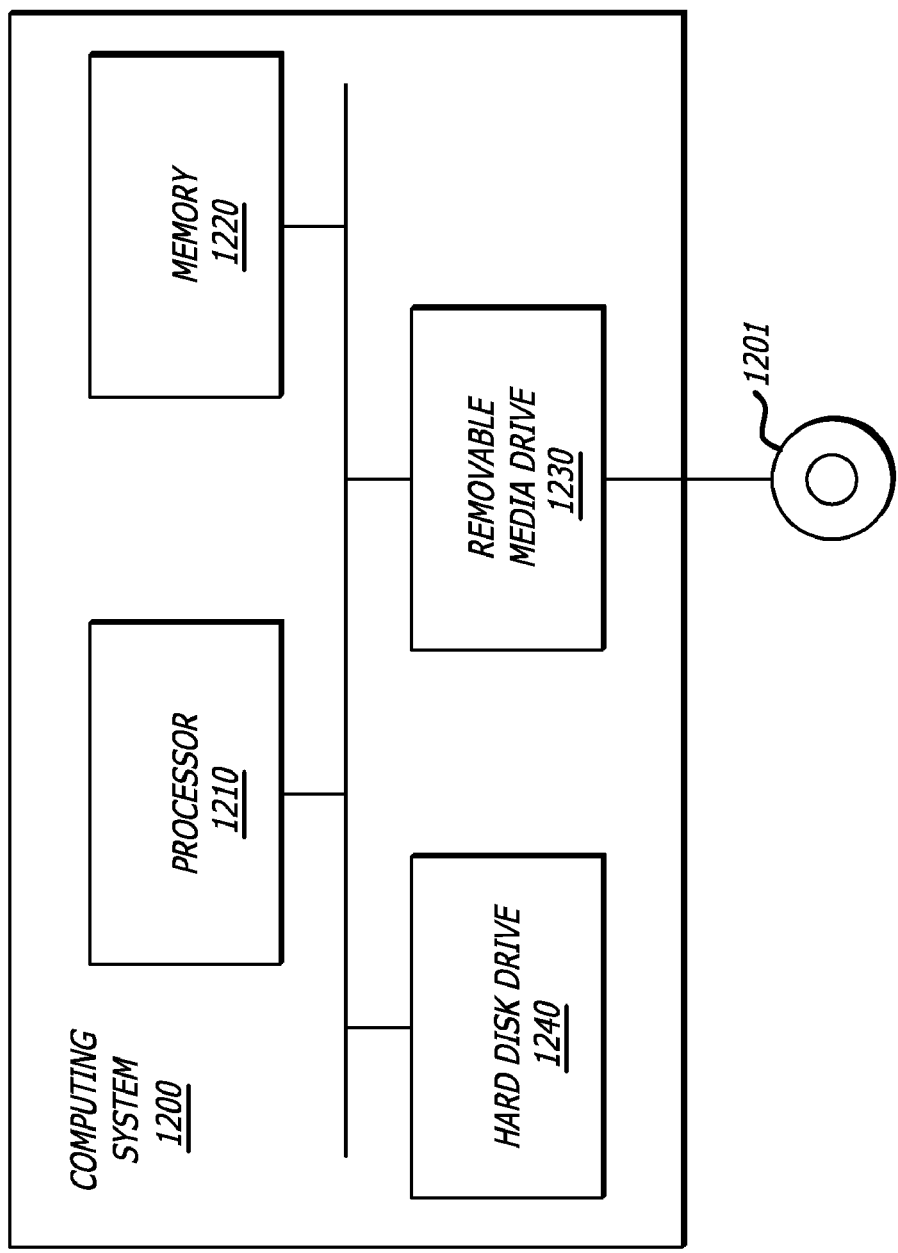
FIG. 12 is a block diagram depicting an exemplary computer system for execution of the S-ETM system and model extraction software.

Referring now to FIG. 12, a computing system 1200 is illustrated that may be used to perform some or all of the processes in accordance with a number of embodiments of the invention. In one embodiment of the invention, the computing system 1200 includes a processor 1210, a memory 1220, a removable media drive 1230, and a hard disk drive 1240. In one embodiment, the processor 1210 executes instructions residing on a machine-readable medium, such as the hard disk drive 1240, a removable medium 1201 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 1220, which may include Random Access Memory (RAM), dynamic RAM (DRAM), etc. The processor 1210 may retrieve the instructions from the memory 1220 and execute the instructions to perform the operations described above.

Note that any or all of the components and the associated hardware illustrated in FIG. 12 may be used in various embodiments of the system 1200. However, it should be appreciated that other configurations of the system 1200 may include more or less devices than those shown in FIG. 12.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

The embodiments of the invention are thus described. While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art.

What is claimed is:

1. A method of analysis of a circuit design, the method comprising:
 receiving a timing graph of a circuit including delay arcs with a statistical function of delay, slew, slack, or arrival time;

determining primary input ports and output ports of the circuit;

identifying timing pins between the input ports and the output ports of the circuit; evaluating the timing pins from input ports to output ports to determine if one or more timing pins can be merged out and reduce the timing graph down to a reduced timing graph;

automatically generating top level timing constraints and standalone timing constraints for the reduced timing graph in response to
- one or more original timing constraints of the timing graph, and
- reduction in the reduced timing graph from the timing graph;

and wherein one or more of the receiving, the determining, the identifying, the evaluating, and the automatically generating are performed with a processor.

2. The method of claim 1, further comprising:
statistically merging one or more delay arcs in the timing graph with a breadth first search traversal order from the input ports in response to statistical arrival times or statistical slack times of the delay arcs in the timing graph.

3. The method of claim 2, wherein
the circuit includes combinational logic associated with one or more delay arcs in the timing graph; and
at least one of the one or more delay arcs in the timing graph associated with the combinational logic are merged by a statistical serial merge operation.

4. The method of claim 2, wherein
the circuit includes combinational logic associated with one or more delay arcs in the timing graph; and
at least one of the one or more delay arcs in the timing graph associated with the combinational logic are merged by a statistical parallel merge operation.

5. The method of claim 1, further comprising:
statistically preserving one or more delay arcs in one or more worst case timing paths in the timing graph from the input ports to the output ports in response to statistical arrival times or statistical slack times of the delay arcs in the timing graph.

6. The method of claim 1, further comprising:
preserving the input ports and output ports of the circuit; and
preserving one or more predetermined timing pins in the circuit so they are not eliminated from the timing graph.

7. The method of claim 6, wherein
the one or more predetermined timing pins of the circuit to preserve include
one or more input pins to one or more respective latches, and
one or more common path pessimism reduction points.

8. The method of claim 6, wherein
the one or more predetermined timing pins of the circuit to preserve include
one or more common path pessimism reduction points.

9. The method of claim 6, wherein
the one or more predetermined timing pins of the circuit to preserve include
one or more assertion points associated with an assertion or a timing constraint.

10. The method of claim 1, further comprising:
detecting and removing one or more self-loop arcs from the reduced timing graph.

11. The method of claim 1, wherein
the statistical function is a probability density function (PDF) or a cumulative density function (CDF) indicating the yield of the circuit in response to the delay time, slack time, slew time, or arrival time.

12. The method of claim 11, wherein
the PDF and the CDF are first order parameterized models to reduce mathematical computations when adding or subtracting PDFs or CDFs respectively together.

13. A non-transitory machine-readable media to store instructions that when executed by a machine causes the machine to perform operations on a circuit design, the operations comprising:
extracting a timing graph of the circuit design including timing arcs between pins with a statistical function of delay, slew, slack, or arrival time;
representing the statistical function of delay, slew, slack, or arrival time by first order parameterized model equations; and
reducing the timing graph of the circuit design by statistically merging a plurality of timing arcs together to simplify computations for a processor and speed up analysis of a larger circuit design including the circuit design, wherein the statistical merging of the plurality of timing arcs together includes accounting for within-die-variations in response to a statistical correlation in grid position of circuit cells associated with the plurality of timing arcs.

14. The non-transitory machine-readable media of claim 13, wherein
the circuit design includes combinational logic forming a plurality of timing arcs in series in the timing graph; and
the reduction of the timing graph includes statistically merging serial timing arcs in the timing graph down to a new timing arc.

15. The non-transitory machine-readable media of claim 14, wherein
the statistical merge of the series of timing arcs in the timing graph includes accounting for within-die-variations in response to a statistical correlation in grid position of circuit cells associated with the serial timing arcs.

16. The non-transitory machine-readable media of claim 13, wherein
the circuit design includes combinational logic forming a plurality of timing arcs in parallel in the timing graph; and
the reduction of the timing graph includes statistically merging parallel timing arcs in the timing graph down to a new timing arc.

17. The non-transitory machine-readable media of claim 16, wherein
the statistical merge of the parallel timing arcs in the timing graph includes accounting for within-die-variations in response to a statistical correlation in grid position of circuit cells associated with the parallel timing arcs.

18. The non-transitory machine-readable media of claim 13, wherein
the circuit design includes sequential logic with a register including one or more timing arcs and one or more check arcs; and
the reduction of the timing graph includes
performing a backwards statistical serial merge to remove a register input pin of the register and generate a first new check value for a hold group and a second new check value for a setup group; and
retaining latch information to retain latch behavior of the register.

19. The non-transitory machine-readable media of claim 13, wherein
the circuit design includes sequential logic including one or more timing arcs and one or more check arcs; and
the reduction of the timing graph includes
performing a forward statistical serial merge to remove a clock pin to the sequential logic and generate a first new check value for a hold group and a second new check value for a setup group; and
retaining latch information to retain latch behavior of the sequential logic.

20. The non-transitory machine-readable media of claim 13, to store instructions that when executed by a machine causes the machine to perform further operations comprising:
validating the reduced timing graph of the circuit design; and
writing out the validated reduced timing graph as a statistical timing model of the circuit design into a cell library.

21. A non-transitory machine-readable media to store instructions that when executed by a machine causes the machine to perform operations on a circuit design that includes one or more original constraints, the operations comprising:
extracting a timing graph of the circuit design including timing arcs between pins with a statistical function of delay, slew, slack, or arrival time;
reducing the timing graph of the circuit design by statistically merging a plurality of timing arcs together to simplify computations for a processor and speed up analysis of a larger circuit design including the circuit design; and
automatically generating one or more new constraints for the circuit design in response to the reduced timing graph of the circuit design and the one or more original constraints, including
generating a top level constraints file with one or more top level constraints for instantiation of the circuit design into the larger circuit design, and
generating a stand alone constraints file with one or more stand alone constraints for validating the reduced timing graph of the circuit design.

22. The non-transitory machine-readable media of claim 21, to store instructions that when executed by a machine causes the machine to perform further operations comprising:
validating the reduced timing graph of the circuit design with the one or more new constraints; and
writing out the validated reduced timing graph as a statistical timing model of the circuit design into a cell library.

23. The non-transitory machine-readable media of claim 21, wherein the automatically generating of the one or more new constraints for the circuit design further includes
writing path exceptions associated with the input ports or output ports of the circuit design into the top level constraints file and the stand alone constraints file without modification;
writing path exceptions associated with one or more internal pins into the top level constraints file and the stand alone constraints file with a modified name prefixed with an instance name; and
writing path exceptions associated with a clock of the circuit design into the top level constraints file and the stand alone constraints file without modification.

24. The non-transitory machine-readable media of claim 21, wherein the automatically generating of the one or more new constraints for the circuit design further includes
preserving one or more clock pins with a clock definition statement.

25. The non-transitory machine-readable media of claim 21, wherein the automatically generating of the one or more new constraints for the circuit design further includes
writing port constraints associated with an input port or an output port of the circuit design into the stand alone constraints file without modification.

26. A system to analyze a circuit design, the system comprising:
a processor;
a non-transitory processor readable medium coupled to the processor, the non-transitory processor readable medium to store instructions that when executed by the processor cause the processor to perform operations including
extracting a timing graph of the circuit design, the timing graph including timing arcs between timing pins, each of the timing arcs having a statistical function of delay, slew, slack, or arrival time;
representing the statistical function of delay, slew, slack, or arrival time by first order parameterized model equations; and
reducing the timing graph of the circuit design by statistically merging a plurality of timing arcs together, the reduced timing graph to simplify computations for a processor and speed up analysis of a larger circuit design including instantiations of the circuit design modeled by the reduced timing graph, wherein the statistical merging of the plurality of timing arcs together includes accounting for within-die-variations in response to a statistical correlation in grid position of circuit cells associated with the plurality of timing arcs.

27. The system of claim 26, wherein
the circuit design includes combinational logic forming a plurality of timing arcs in series in the timing graph; and
the reducing of the timing graph includes statistically merging a plurality of serial timing arcs in the timing graph down to a single timing arc, wherein the statistical merge of the serial timing arcs in the timing graph includes accounting for within-die-variations in response to a statistical correlation in grid position of circuit cells associated with the serial timing arcs.

28. The system of claim 26, wherein
the circuit design includes combinational logic forming a plurality of timing arcs in parallel in the timing graph; and
the reduction of the timing graph includes statistically merging a plurality of parallel timing arcs in the timing graph down to a single timing arc, wherein the statistical merge of the parallel timing arcs in the timing graph includes accounting for within-die-variations in response to a statistical correlation in grid position of circuit cells associated with the parallel timing arcs.

29. The system of claim 26, wherein
the circuit design includes sequential logic including one or more timing arcs and one or more check arcs; and
the reduction of the timing graph includes
performing a backwards statistical serial merge to remove a register input pin and generate a first new check value for a hold group and a second new check value for a setup group and,
retaining latch information to retain latch behavior of the register.

* * * * *